US012000918B2

(12) United States Patent
An et al.

(10) Patent No.: US 12,000,918 B2
(45) Date of Patent: Jun. 4, 2024

(54) SYSTEMS AND METHODS OF RECONSTRUCTING MAGNETIC RESONANCE IMAGES USING DEEP LEARNING

(71) Applicants: Hongyu An, St. Louis, MO (US); Ulugbek Kamilov, St. Louis, MO (US); Weijie Gan, St. Louis, MO (US); Cihat Eldeniz, St. Louis, MO (US); Jiaming Liu, St. Louis, MO (US)

(72) Inventors: Hongyu An, St. Louis, MO (US); Ulugbek Kamilov, St. Louis, MO (US); Weijie Gan, St. Louis, MO (US); Cihat Eldeniz, St. Louis, MO (US); Jiaming Liu, St. Louis, MO (US)

(73) Assignee: Washington University, St. Louis, MO (US)

( * ) Notice: Subject to any disclaimer, the term of this patent is extended or adjusted under 35 U.S.C. 154(b) by 358 days.

(21) Appl. No.: 17/079,177

(22) Filed: Oct. 23, 2020

(65) Prior Publication Data
US 2021/0123999 A1    Apr. 29, 2021

Related U.S. Application Data

(60) Provisional application No. 62/926,334, filed on Oct. 25, 2019.

(51) Int. Cl.
*G01R 33/56* (2006.01)
*G01R 33/48* (2006.01)
(Continued)

(52) U.S. Cl.
CPC ....... *G01R 33/5608* (2013.01); *G01R 33/481* (2013.01); *G01R 33/4826* (2013.01);
(Continued)

(58) Field of Classification Search
CPC .............. G01R 33/5608; G01R 33/481; G01R 33/4826; G01R 33/567; G06T 7/0012; G06T 2207/10088; G06T 2207/20084
See application file for complete search history.

(56) References Cited

U.S. PATENT DOCUMENTS

2017/0214138 A1* 7/2017 Erturk ................... H01Q 1/22
2019/0057505 A1* 2/2019 Pheiffer ............... G06T 7/0016
(Continued)

FOREIGN PATENT DOCUMENTS

CN          107871332 A  *  4/2018  ........... G06T 11/008

OTHER PUBLICATIONS

Bouttou Leon, "Stochastic Gradient Descent Tricks", 2012, Neural Networks: Tricks of the Trade, 2nd ed., vol. 7700, Lecture Notes in Computer Science Series, Springer, pp. 421-436.
(Continued)

*Primary Examiner* — Wednel Cadeau
(74) *Attorney, Agent, or Firm* — Armstrong Teasdale LLP

(57) ABSTRACT

A computer-implemented method of reconstructing magnetic resonance (MR) images of a subject is provided. The method includes executing a neural network model for analyzing MR images, wherein the neural network model is trained with a first subset of training MR images as inputs and a second subset of the training MR images as outputs, wherein each image in the first subset is acquired during a neighboring respiratory phase of at least one of the images in the second subset. The method further includes receiving MR signals, reconstructing crude MR images based on the MR signals, analyzing the crude MR images using the neural network model, deriving clear MR images based on the analysis, wherein the clear MR images include reduced artifacts, compared to the crude MR images, and outputting the clear MR images.

20 Claims, 22 Drawing Sheets
(8 of 22 Drawing Sheet(s) Filed in Color)

(51) Int. Cl.
G01R 33/567 (2006.01)
G06T 7/00 (2017.01)
(52) U.S. Cl.
CPC .......... *G01R 33/567* (2013.01); *G06T 7/0012* (2013.01); *G06T 2207/10088* (2013.01); *G06T 2207/20081* (2013.01); *G06T 2207/20084* (2013.01)

(56) References Cited

U.S. PATENT DOCUMENTS

2019/0336033 A1* 11/2019 Takeshima ......... G01R 33/5602
2020/0129784 A1* 4/2020 Bériault ................... G06N 3/08

OTHER PUBLICATIONS

Chandarana et al., "Free-Breathing Radial 3D Fat-Suppressed T1-Weighted Gradient Echo Sequence: A Viable Alternative for Contrast-Enhanced Liver Imaging in Patients Unable to Suspend Respiration", Oct. 2011, Invest Radiol., vol. 46, No. 10, pp. 648-653.
Chandarana et al., "Respiratory Motion-Resolved Compressed Sensing Reconstruction of Free-Breathing Radial Acquisition for Dynamic Liver Magnetic Resonance Imaging", Nov. 2015, Invest Radiol., vol. 50, No. 11, pp. 749-756.
Donoho David L., "Compressed Sensing", Apr. 2006, IEEE Transactions on Information Theory, vol. 52, No. 4, pp. 1289-1306.
Ehman et al., "Magnetic Resonance Imaging with Respiratory Gating: Techniques and Advantages", Dec. 1984, AJR Am J Roentgenol., vol. 143, No. 6, pp. 1175-1182.
Ehman et al., "Adaptive Technique for High-Definition MR Imaging of Moving Structures", Oct. 1989, Radiology, vol. 173, No. 1, pp. 255-263.
Eldeniz et al., "Consistently Acquired Projections for Tuned and Robust Estimation—A Self-Navigated Respiratory Motion Correction Approach", May 2018, Invest Radiol., vol. 53, No. 5, pp. 293-305.
Feng et al., "Golden-Angle Radial Sparse Parallel MRI: Combination of Compressed Sensing, Parallel Imaging, and Golden-Angle Radial Sampling for Fast and Flexible Dynamic Volumetric MRI", Sep. 2014, Magn Reson Med., vol. 72, No. 3, pp. 707-717.
Feng et al., "XD-GRASP: Golden-Angle Radial MRI with Reconstruction of Extra Motion-State Dimensions Using Compressed Sensing", Feb. 2016, Magn Reson Med., vol. 75, No. 2, pp. 775-788.
Feng et al., "Five-Dimensional Whole-Heart Sparse MRI", Feb. 2018, Magn Reson Med., vol. 79, No. 2, pp. 826-838.
Fessler et al., "Nonuniform Fast Fourier Transforms Using Min-Max Interpolation", Feb. 2003, IEEE Trans Signal Process, vol. 51, No. 2, pp. 560-574.
Grimm et al., "Self-Gated MRI Motion Modeling for Respiratory Motion Compensation in Integrated PET/MRI", Sep. 2014, Medical Image Analysis, vol. 19, No. 1, pp. 110-120.
Han et al., "Deep Learning with Domain Adaptation for Accelerated Projection-Reconstruction MR", Mar. 2017, Magnetic Resonance in Medicine, vol. 80, No. 3, pp. 1189-1205.
Higano et al., "Retrospective Respiratory Self-Gating and Removal of Bulk Motion in Pulmonary UTE MRI of Neonates and Adults", Mar. 2017, Magn Reson Med., vol. 77, No. 3, pp. 1284-1295.
Huang et al., "Compressed Sensing MRI Reconstruction with Multiple Sparsity Constraints on Radial Sampling", Feb. 2019, Mathematical Problems in Engineering, 14 Pages.
Jiang et al., "Motion Robust High Resolution 3D Free-Breathing Pulmonary MRI Using Dynamic 3D Image Self-Navigator", Oct. 2017, Magn. Reson. Med., vol. 79, No. 6, pp. 2954-2967.
Kingma et al., "Adam: A Method for Stochastic Optimization", May 2015, International Conference on Learning Representations (ICLR) San Diego, 15 Pages.
Lau et al., "Intensity-Modulated Microbend Fiber Optic Sensor for Respiratory Monitoring and Gating During MRI", May 2013, IEEE Transactions on Biomedical Engineering, vol. 60, No. 9, pp. 2655-2662.
Lee et al., "Deep Residual Learning for Accelerated MRI Using Magnitude and Phase Networks", Apr. 2018, IEEE Transactions on Biomedical Engineering, vol. 65, No. 9, pp. 1985-1995.
Lehtinen et al., "Noise2Noise: Learning Image Restoration without Clean Data", Oct. 2018, arXiv:1803.04189, url: http://arxiv.org/abs/1803.04189, 12 Pages.
Lin et al., "Respiratory Motion-Compensated Radial Dynamic Contrast-Enhanced (DCE)-MRI of Chest and Abdominal Lesions", Nov. 2008, Magn. Reson. Med., vol. 60, No. 5, pp. 1135-1146.
Lundervold et al., "An Overview of Deep Learning in Medical Imaging Focusing on MRI", May 2019, Zeitschrift für Medizinische Physik, vol. 29, No. 2, pp. 102-127.
Lustig et al., "Sparse MRI: The Application of Compressed Sensing for Rapid MR Imaging", Oct. 2007, Magn. Reson. Med., vol. 58, No. 6, pp. 1182-1195.
Paling et al., "Respiration Artifacts in MR Imaging: Reduction by Breath Holding", 1986, J Comput Assist Tomogr., vol. 10, No. 6, pp. 1080-1082.
Picard et al., "Motion Correction of PET Images Using Multiple Acquisition Frames", May 1997, IEEE transactions on Medical Imaging, vol. 16, No. 2, pp. 137-144.
Qiao et al., "A Motion-Incorporated Reconstruction Method for Gated PET Studies", Jul. 2006, Phys Med Biol., vol. 51, No. 15, pp. 3769-3783.
Song et al., "Respiratory Motion Prediction and Prospective Correction for Free-Breathing Arterial Spin-Labeled Perfusion MRI of the Kidneys", Mar. 2017, Med. Phys., vol. 44, No. 3, pp. 962-973.
Tibiletti et al., "Multistage Three-Dimensional UTE Lung Imaging by Image-Based Self-Gating", May 2015, Magn Reson Med., vol. 75, No. 3, pp. 1324-1332.
Wang et al., "Accelerating Magnetic Resonance Imaging via Deep Learning", Apr. 2016, Proc IEEE Int Symp Biomed Imaging, pp. 514-517.

* cited by examiner

FIG. 6A
FIG. 6B
1602 FIG. 6C
1604 FIG. 6D MCNUFFT Static 10 phases  MCNUFFT Motion 10 phases P2P Static 10 phases  P2P Motion 10 phases

SYSTEMS AND METHODS OF RECONSTRUCTING MAGNETIC RESONANCE IMAGES USING DEEP LEARNING

CROSS-REFERENCE TO RELATED APPLICATIONS

This application claims the benefit of U.S. Provisional Application Ser. No. 62/926,334 filed Oct. 25, 2019, the entire disclosure of which is hereby incorporated by reference in its entirety.

BACKGROUND

The field of the disclosure relates generally to systems and methods of medical image reconstruction, and more particularly, to systems and methods of reconstructing medical images using a neural network model.

Magnetic resonance imaging (MRI) has proven useful in diagnosis of many diseases. MRI provides detailed images of soft tissues, abnormal tissues such as tumors, and other structures, which cannot be readily imaged by other imaging modalities, such as computed tomography (CT). Further, MRI operates without exposing patients to ionizing radiation experienced in modalities such as CT and x-rays.

However, respiratory motion compromises image quality in thoracic and abdominal MR imaging. Breath holding, external tracking devices, acquisition-based tracking methods have been used to address this issue. Radial MR data acquisition has been developed to detect respiratory motion and the imaging data collected over many respiratory cycles are binned into a number of respiratory phases in order to avoid respiratory motion blurring. However, this results in a set of undersampled k-space data for each respiratory phase, leading to poor signal-to-noise ratio (SNR) and streaking artifacts in the reconstructed MR images. To overcome the challenges of reconstructing under-sampled MR data, compressed sensing (CS) reconstruction has been developed. A CS method uses an iterative algorithm by minimizing a cost function including data fidelity and regularization terms based on prior knowledge. The selection of the regularization parameters, however, is often empirical, and the iterative optimization is computationally intensive and time consuming, which is challenging for routine clinical use.

Deep learning (DL) methods have been explored in MR image reconstruction. A ground truth reference is typically required as a learning target in the training of deep networks. However, such ground truth references are very difficult to obtain in practice.

This background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

In one aspect, a computer-implemented method of reconstructing magnetic resonance (MR) images of a subject is provided. The method includes executing a neural network model for analyzing MR images, wherein the neural network model is trained with a first subset of training MR images as inputs and a second subset of the training MR images as outputs, wherein each image in the first subset was acquired during a neighboring respiratory phase of at least one of the images in the second subset. The method further includes receiving MR signals, reconstructing crude MR images based on the MR signals, analyzing the crude MR images using the neural network model, deriving clear MR images based on the analysis, wherein the clear MR images include reduced artifacts, compared to the crude MR images, and outputting the clear MR images.

In another aspect, a MR image reconstruction system is provided. The system includes a MR image reconstruction computing device, the MR image reconstruction computing device including at least one processor in communication with at least one memory device. The at least one processor is programmed to execute a neural network model for analyzing MR images, wherein the neural network model is trained with a first subset of training MR images as inputs and a second subset of the training MR images as outputs, wherein each image in the first subset was acquired during a neighboring respiratory phase of at least one of the images in the second subset. The at least one processor is further programmed to receive MR signals, reconstruct crude MR images based on the MR signals, analyze the crude MR images using the neural network model, derive clear MR images based on the analysis, wherein the clear MR images include reduced artifacts, compared to the crude MR images, and output the clear MR images.

In yet another aspect, a computer-implemented method of reconstructing MR images of a subject is provided. The method includes receiving crude MR images reconstructed based on MR signals. The method also includes training a neural network model using the crude MR images as training MR images by inputting a first subset of the crude MR images to the neural network model, setting a second subset of the crude images as target outputs of the neural network model, wherein each image in the first subset was acquired during a neighboring respiratory phase of at least one of the images in the second subset, analyzing the first subset of the crude MR images using the neural network model, comparing outputs of the neural network model with the target outputs, and adjusting the neural network model based on the comparison. The trained neural network model is configured to reduce artifacts in the crude MR images.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

DRAWINGS

The patent or application file includes at least one drawing executed in color. Copies of this patent or patent application publication with color drawing(s) will be provided by the Office upon request and payment of the necessary fee.

FIG. 6A shows motion vector field (MVF) based on an image reconstructed by NUFFT.

FIG. 6B shows MVF based on an image reconstructed by CS.

FIG. 6C shows MVF based on an image reconstructed by neural network model shown in FIG. 3B.

FIG. 6D shows MVF based on an image reconstructed by neural network model shown in FIG. 3C.

DETAILED DESCRIPTION

The disclosure includes systems and methods of reconstructing magnetic resonance (MR) images of a subject using a neural network model trained without ground truth or surrogate ground truth. As used herein, a subject is a human, an animal, or a phantom. The method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as B0 and extends in the longitudinal or z direction. In acquiring an MRI image, a magnetic field (referred to as an excitation field B1), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B1 is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
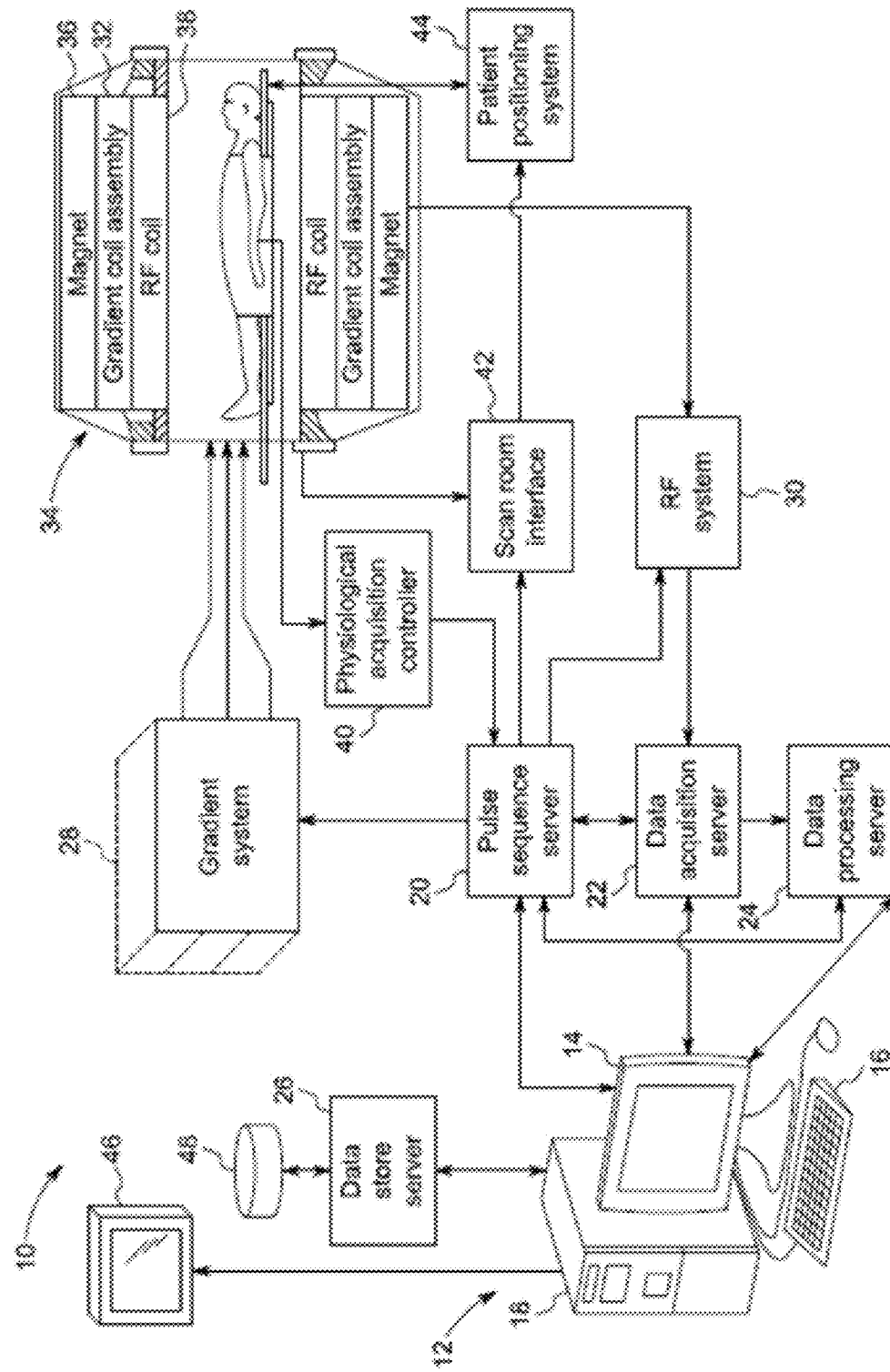
FIG. 1 is a schematic diagram of an exemplary magnetic resonance imaging (MRI) system.

FIG. 1 illustrates a schematic diagram of an exemplary MRI system 10. In the exemplary embodiment, the MRI system 10 includes a workstation 12 having a display 14 and a keyboard 16. The workstation 12 includes a processor 18, such as a commercially available programmable machine running a commercially available operating system. The workstation 12 provides an operator interface that allows scan prescriptions to be entered into the MRI system 10. The workstation 12 is coupled to a pulse sequence server 20, a data acquisition server 22, a data processing server 24, and a data store server 26. The workstation 12 and each server 20, 22, 24, and 26 communicate with each other. Other embodiments may include different components, and/or components may be combined. For example, in other embodiments, the servers 20, 22, 24, and 26 may be part of the workstation 12, or may be combined in one sever.

In the exemplary embodiment, the pulse sequence server 20 responds to instructions downloaded from the workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. The RF coil 38 is shown as a whole body RF coil. The RF coil 38 may also be a local coil that may be placed in proximity to the anatomy to be imaged, or a coil array that includes a plurality of coils.

In the exemplary embodiment, gradient waveforms used to perform the prescribed scan are produced and applied to the gradient system 28, which excites gradient coils in the gradient coil assembly 32 to produce the magnetic field gradients $G_x$, $G_y$, and $G_z$ used for position-encoding MR signals. The gradient coil assembly 32 forms part of a magnet assembly 34 that also includes a polarizing magnet 36 and the RF coil 38.

In the exemplary embodiment, the RF system 30 includes an RF transmitter for producing RF pulses used in MR pulse sequences. The RF transmitter is responsive to the scan prescription and direction from the pulse sequence server 20 to produce RF pulses of a desired frequency, phase, and pulse amplitude waveform. The generated RF pulses may be applied to the RF coil 38 by the RF system 30. Responsive MR signals detected by the RF coil 38 are received by the RF system 30, amplified, demodulated, filtered, and digitized under direction of commands produced by the pulse sequence server 20. The RF coil 38 is described as a transmitter and receiver coil such that the RF coil 38 transmits RF pulses and detects MR signals. In one embodiment, the MRI system 10 may include a transmitter RF coil that transmits RF pulses and a separate receiver coil that detects MR signals. A transmission channel of the RF system 30 may be connected to a RF transmission coil and a receiver channel may be connected to a separate RF receiver coil. Often, the transmission channel is connected to the whole body RF coil 38 and each receiver section is connected to a separate local RF coil.

In the exemplary embodiment, the RF system 30 also includes one or more RF receiver channels. Each RF receiver channel includes an RF amplifier that amplifies the MR signal received by the RF coil 38 to which the channel is connected, and a detector that detects and digitizes the I and Q quadrature components of the received MR signal. The magnitude of the received MR signal may then be determined as the square root of the sum of the squares of the I and Q components as in Eq. (1) below:

$$M = \sqrt{I^2 + Q^2} \quad (1);$$

and the phase of the received MR signal may also be determined as in Eq. (2) below:

$$\varphi = \tan^{-1}\left(\frac{Q}{I}\right). \quad (2)$$

In some embodiments, the pulse sequence server 20 also optionally receives subject data from a physiological acquisition controller 40. The controller 40 receives physiological signals from sensors connected to the subject, such as electrocardiograph ("ECG") signals from electrodes, or respiratory signals from a respiratory monitoring device such as a bellows. The physiological signals are typically used by the pulse sequence server 20 to synchronize, or "gate," the performance of the scan with the subject's heart beat or respiration.

In the exemplary embodiment, the pulse sequence server 20 also connects to a scan room interface circuit 42 that receives signals from sensors associated with the condition of the subject and the magnet system. Through the scan room interface circuit 42, a patient positioning system 44 receives commands to move the subject to desired positions before and/or during the scan.

In the exemplary embodiment, the digitized MR signal samples produced by the RF system 30 are received by the data acquisition server 22. The data acquisition server 22 may operate in response to instructions downloaded from the workstation 12 to receive real-time MR data and provide buffer storage such that no data is lost by data overrun. In some scans, the data acquisition server 22 does little more than pass the acquired MR data to the data processing server 24. In scans that need information derived from acquired MR data to control further performance of the scan, however, the data acquisition server 22 is programmed to produce the needed information and convey it to the pulse sequence server 20. For example, during prescans, MR data is acquired and used to calibrate the pulse sequence performed by the pulse sequence server 20. Also, navigator signals may be acquired during a scan and used to adjust the operating parameters of the RF system 30 or the gradient system 28, or to control the view order in which k-space is sampled.

In the exemplary embodiment, the data processing server 24 receives MR data from the data acquisition server 22 and processes it in accordance with instructions downloaded from the workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the exemplary embodiment, images reconstructed by the data processing server 24 are conveyed back to, and stored at, the workstation 12. In some embodiments, real-time images are stored in a database memory cache (not shown in FIG. 1), from which they may be output to operator display 14 or a display 46 that is located near the magnet assembly 34 for use by attending physicians. Batch mode images or selected real time images may be stored in a host database on disc storage 48 or on a cloud. When such images have been reconstructed and transferred to storage, the data processing server 24 notifies the data store server 26. The workstation 12 may be used by an operator to archive the images, produce films, or send the images via a network to other facilities.

MR imaging acquisition along a non-Cartesian trajectory is typically less sensitive to motion than acquisition along a Cartesian grid. Thoracic and abdominal imaging, therefore, often uses non-Cartesian trajectories to reduce effects from respiratory motion, for example, stacks of stars acquisition, where the trajectory includes a plurality of kx-ky segments along a kz direction, each of the plurality of kx-ky segments includes radial spokes. Non-Cartesian acquisition, however, samples high spatial frequencies sparsely, compared to Cartesian sampling. As a result, artifacts and noise like streaking artifacts result in the reconstructed MR images. Unlike signals, which represent the anatomies of the subject, artifacts are visual anomalies in the medical images that are not present in the subject, which may be caused by the imaging modality such as the pulse sequences, gradient non-linearities, poor fat saturation, or motion. Artifacts used herein may also include noise.

Compressed sensing (CS) reconstruction may be used to reconstruct MR images of reduced artifacts. In CS, the selection of the regularization parameters is often empirical, and the CS reconstruction is computationally intensive and time consuming, for example taking 7-8 hours to reconstruct 3D MR images. A neural network model may be used in reconstruction. The training of a neural network model in a supervised learning typically requires ground truth or surrogate ground truth, which is difficult to obtain in practice, especially in medical imaging.

Figure 2A:
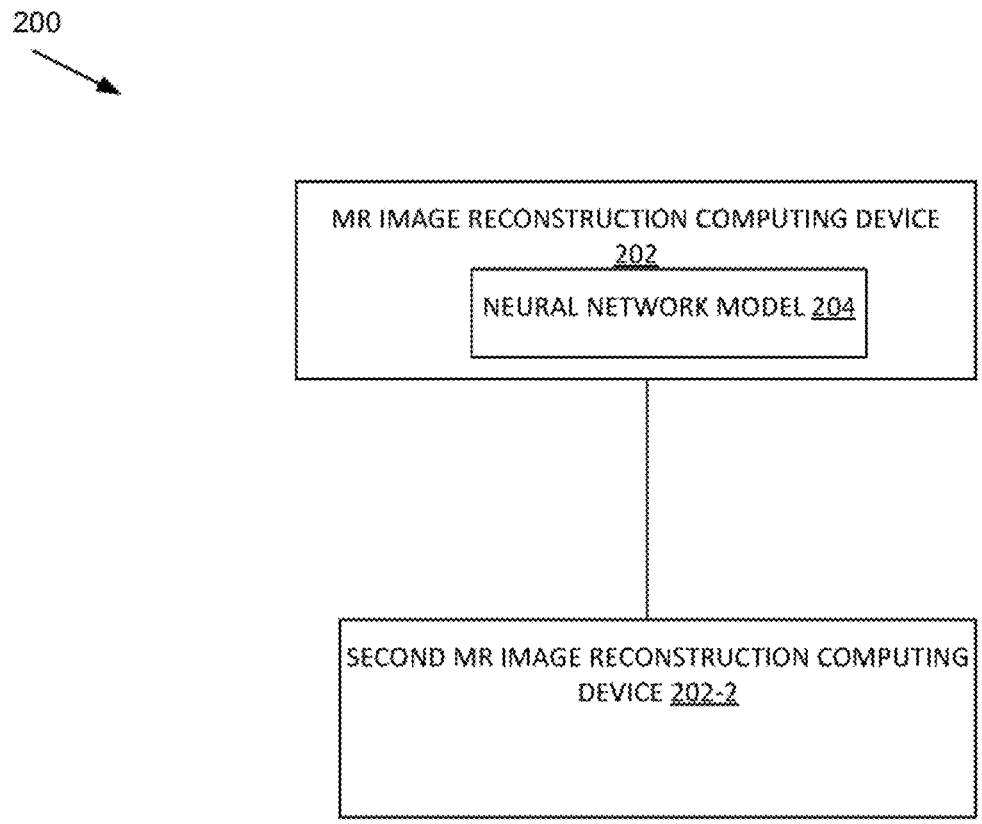
FIG. 2A is a schematic diagram of an exemplary MR image reconstruction system.

FIG. 2A is a schematic diagram of an exemplary MR image reconstruction system 200. In the exemplary embodiment, the system 200 includes an MR image reconstruction computing device 202 configured to generate MR images of reduced artifacts. The computing device 202 further includes a neural network model 204. The system 200 may include a second MR image reconstruction computing device 202-2. The second MR image reconstruction computing device 202-2 may be used to train the neural network model 204, and the MR image reconstruction computing device 202 may then use the trained neural network model 204. The second MR image reconstruction computing device 202-2 may be the same computing device as the MR image reconstruction computing device 202 such that the training and use of the neural network model 204 are on one computing device. Alternatively, the second MR image reconstruction computing device 202-2 may be a computing device separate from the MR image reconstruction computing device 202 such that the training and use of the neural network model 204 are executed on separate computing devices. The MR image reconstruction computing device 202 may be included in the workstation 12 of the MRI system 10, or may be included on a separate computing device that is in communication with the workstation 12.

Figure 2B:
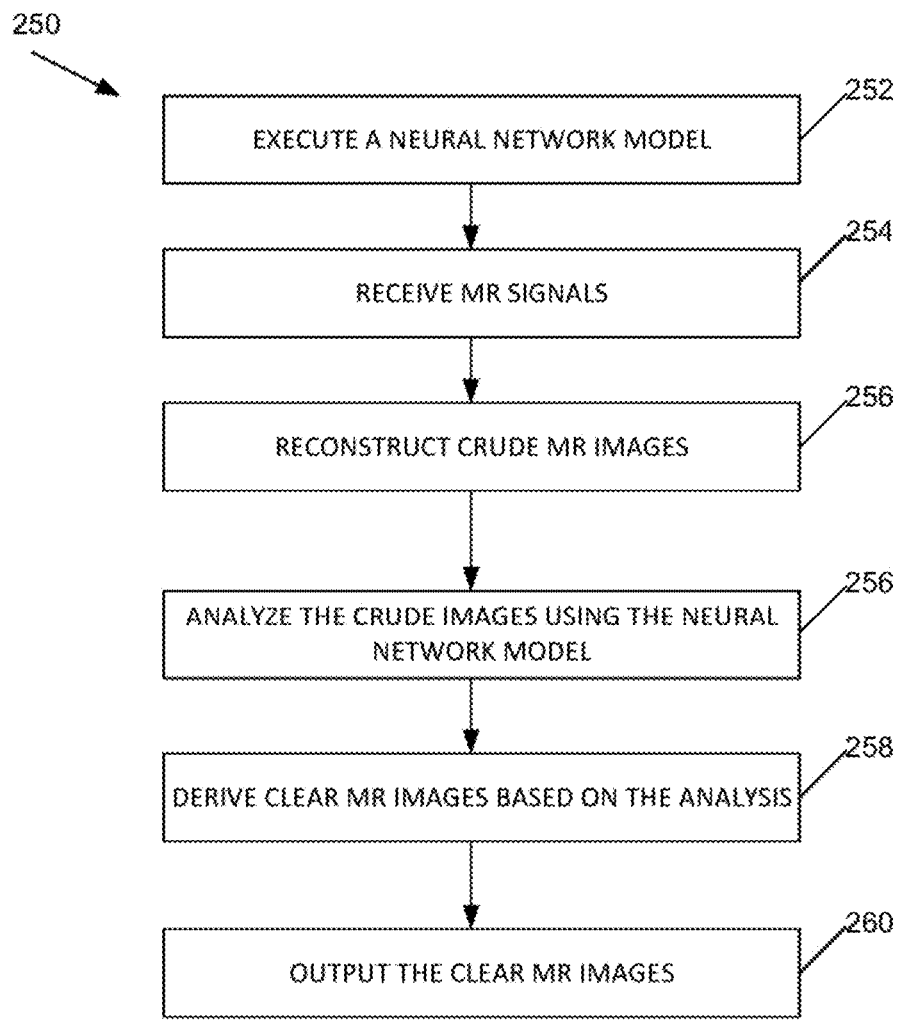
FIG. 2B is a flow chart of an exemplary method of reconstruction.

FIG. 2B is a flow chart of an exemplary method 250. The method 250 may be implemented on the MR image reconstruction system 200. In the exemplary embodiment, the method includes executing 252 a neural network model for analyzing MR images. The neural network model is trained with a first subset of training MR images as inputs and a second subset of the training MR images as outputs. Each image in the first subset is acquired during a neighboring respiratory phase of at least one of the images in the second subset. Respiration may be viewed as a cyclic curve. During a period of a respiratory curve, respiration includes two major phases of inspiration and expiration, and may be divided into a number of phases, such as 10, between the initiation of inspiration to the next initiation of inspiration. See FIG. 9B (shown later) for an exemplary respiratory curve. For example, if a respiratory curve of a subject is divided into 10 phases, the MR images of the subject may be regrouped or rebinned into 10 phases according to the time, i.e., the corresponding phase, when the MR images are acquired. In one embodiment, the inputs of the neural network model 204 are MR images of odd phases, like 1, 3, . . . , 9 and the outputs of the neural network model 204 are MR images of even phases, like 2, 4, . . . , 10.

In the exemplary embodiment, the method 250 further includes receiving 254 MR signals. The method 250 also includes reconstructing crude MR images based on the MR signals. Crude MR images used herein are MR images that include artifacts and noise, and may be reconstructed by directly Fourier transforming the MR signals without additional corrections to reduce the artifacts. In one embodiment, receiving 254 MR signals and reconstructing 256 crude MR images are skipped, and the method 250 includes receiving crude MR images, where the crude MR images have been reconstructed elsewhere, and are inputted into the MR reconstruction system 200. The method further includes analyzing 256 the crude MR images using the neural network model. The crude MR images may be directly inputted into the neural network, where the neural network model 204 may include one or more layer of neurons configured to generate clear MR images based on crude images. Clear MR images used herein are MR images include reduced artifacts and noise, compared to the crude MR images. The trained neural network model 204 is configured to reduce or remove the artifacts and noise in the crude MR images. Further, the method 250 includes deriving 258 clear MR images based on the analysis. In addition, the method 250 includes outputting 260 the clear MR images.

Figure 3A:
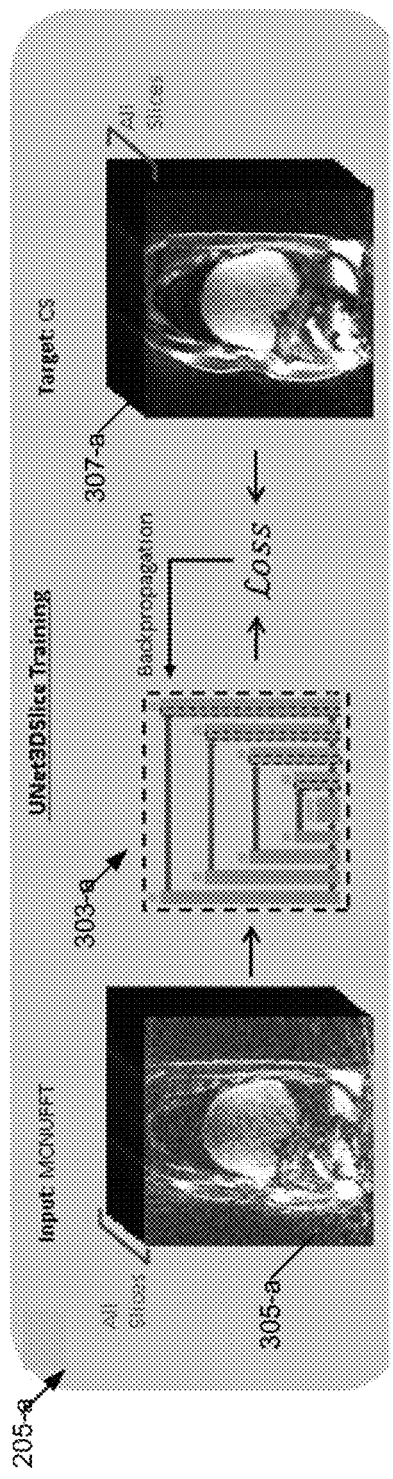
FIG. 3A is a schematic diagram of a neural network model using images reconstructed by compressed sensing (CS) as targets.
Figure 3B:
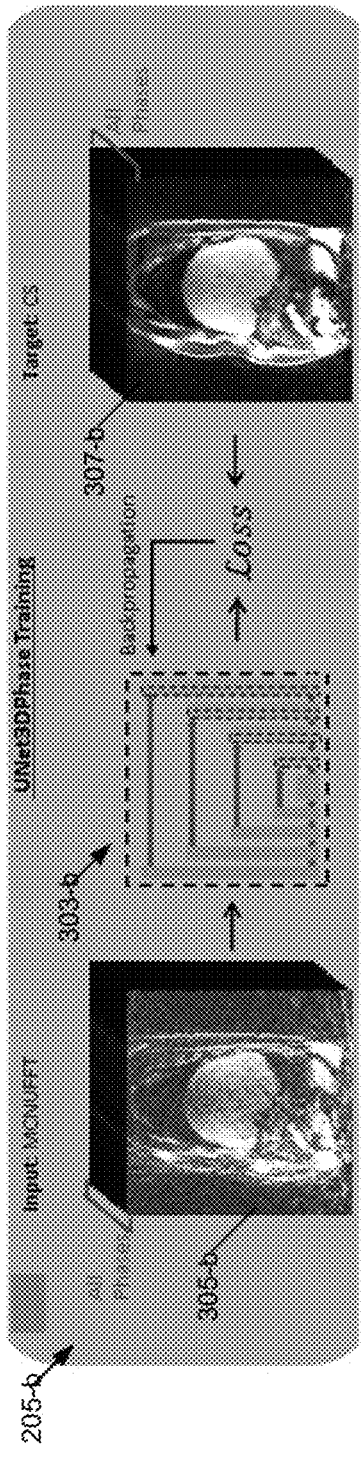
FIG. 3B is a schematic diagram of another neural network model using images reconstructed by CS as targets.

FIGS. 3A-3D are schematic diagrams of an exemplary neural network model 204 (FIG. 3C) and of testing a trained neural network model (FIG. 3D), comparing with schematic diagrams of two known neural network models 205-a, 205-b (FIGS. 3A and 3B). The neural network models 205-a, 205-b may include a convolutional neural network 303-a, 303-b, respectively.

The MR images may be referred to as 3D image data, and include a series of MR images of a 3D volume at different time such as at different respiratory phases. In other words, the dataset includes a series of blocks of 3D images at different respiratory phases, and each block of the 3D images is of the 3D volume, and has three dimensions, x, y, z, or read-out, phase encoding, and slice directions.

A neural network model 204 is often trained before being used for inference of a designed purpose. Typically, in a supervised learning, ground truth is required to be provided as the target output. Ground truth, however, is not always available. For example, the neural network model 204 is designed to reduce and/or remove artifacts and noise in crude images. Images devoid of artifacts and noise are often unavailable because some level of artifacts and noise is unavoidable due to causes like system imperfection, and subject's bulk and physiological motion. In FIGS. 3A and 3B, surrogate ground truth is used instead, where clear images that are reconstructed with methods to reduce artifacts and noise are used as target outputs. In one example, the clear images are reconstructed with CS, which is slow, and may take hours to reconstruct a series of 3D images.

In FIG. 3A, the inputs of the neural network 303-a are blocks of crude 3D images 305-a and outputs of the neural network 303-a are corresponding clear 3D images 307-a. During training, outputs may be referred to as targets or target outputs. The outputs 307-a may be reconstructed by CS. Images 305-a and 307-a are blocks of 3D images with each block having x, y, z directions. Similar to FIG. 3A, in FIG. 3B, the inputs are crude images 305-b and outputs are corresponding images 307-b for the neural network model 303-b. The images 305-b, 307-b in FIG. 3B are the same image dataset as images 305-a, 307-a, but are arranged differently. Each block of the images 305-b, 307-b are a plurality of x-y plane images arranged along their respiratory phases in the third dimension, instead of being arranged along their slices in the third dimension for images 305-a, 307-a. For example, input images 305-a and output images 307-a are 3D images of all slices at a respiratory phase with the dimensions in each block of 3D images are x, y, and z (or slice), while input images 305-b and output images 307-b are 3D images of all respiratory phases of a certain slice, with each block of 3D images in dimensions of x, y, and respiratory phase. The neural network 305-a may be referred to as UNet3DSlice, and may include the number of spokes in the reference, such as UNet3DSlice800. The neural network 305-b may be referred to as UNet3DPhase, and may also include the number of spokes in the reference, such as UNet3DPhase800.

Figure 3C:
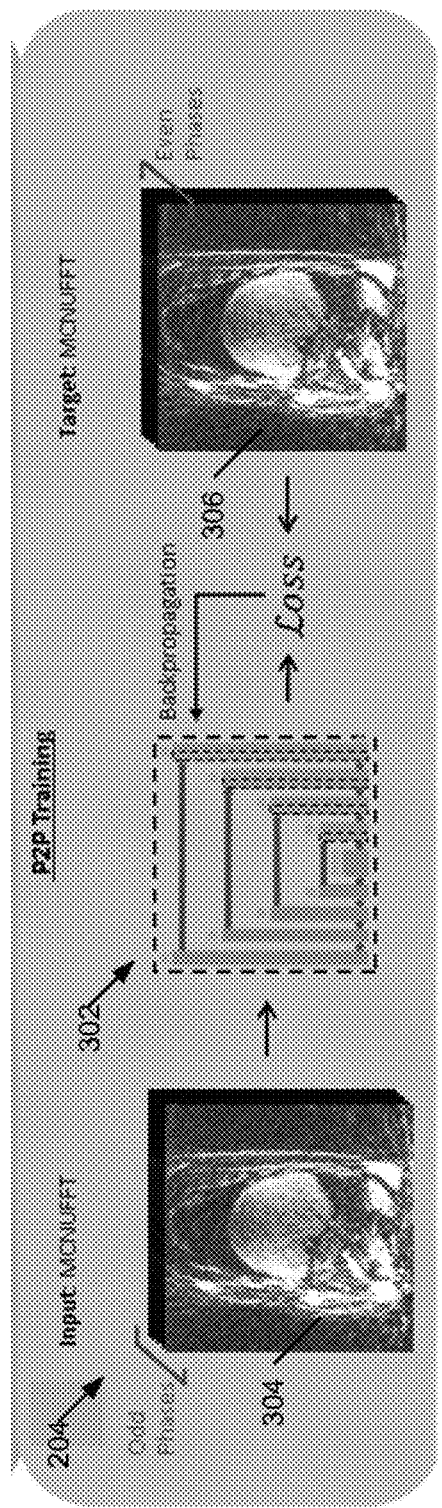
FIG. 3C is a schematic diagram of an exemplary neural network model without the use of ground truth or surrogate truth.
Figure 3D:
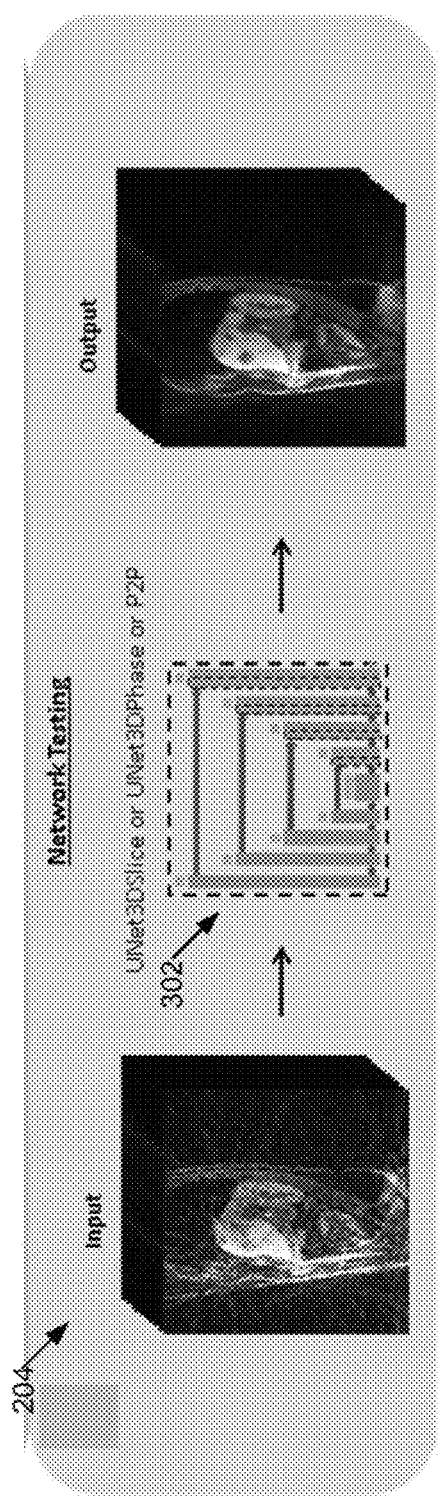
FIG. 3D is a schematic diagram of testing the neural network models shown in FIGS. 3A-3C.

The neural network model 204 includes a neural network 302. The neural network 302 may be a convolutional network, and may be a U-Net. In contrast to the neural network models 205-a, 205-b shown in FIGS. 3A and 3B, surrogate ground truth is not used to train the neural network 302 (FIG. 3C). The inputs 304 and outputs 306 of the neural network 302 are both crude images. The inputs 304 are blocks of 3D crude images, with each block including x-y plane images along a first group of respiratory phases. The outputs 306 are also blocks of 3D crude images, with each block including x-y plane images along a second group of respiratory phases.

For example, the inputs 304 are x-y plane images along all odd respiratory phases of a certain slice, and the outputs 306 are x-y plane images along all even respiratory phases of that slice. The neural network 302 may be referred to as phase-to-phase or P2P, and may include the number of spokes in the reference such as P2P800. Compared to the neural networks 303-a, 303-b in FIGS. 3A and 3B, which require surrogate ground truth reconstructed with a method such as CS that may take hours, the neural network 302 in FIG. 3C does not need ground truth or surrogate ground truth. Instead, different subsets of blocks of crude images are used as inputs and outputs. The neural network model 204 is adjusted during the training. Once the neural network model 204 is trained, the neural network model 204 is used to reduce/remove artifacts and noise and to derive clear images (FIG. 3D), where crude images are input into the neural network model 204 and clear images are output from the trained neural network model 204. The time that it takes to derive clear images are greatly improved, for example, it may take seconds, instead of hours for CS reconstruction.

The differences among FIGS. 3A-3C are further explained with the following examples. In one example, a respiratory signal was detected and then used to bin the MR images into a plurality of respiratory phases, such as ten respiratory phases. A k-space trajectory of stacks of stars are used to acquire MR signals, where a 3D volume is selected, and the kz direction is Cartesian encoded while each kx-ky planes are scanned with a plurality of radial lines or spokes crossing the center of the kx-ky plane. In one example, 96 slices were acquired, and various numbers of radial spokes (400, 800, 1200, 1600, and 2000), corresponding to about 1-, 2-, 3-, 4- and 5-minute acquisitions, respectively, were used to acquire MR signals. The higher the number of spokes is, the higher the image quality is, but also longer it takes to acquire the MR signals. In deriving crude MR images, a multi-coil non-uniform inverse fast Fourier transform (MCNUFFT) was used, where a non-uniform inverse fast Fourier transform (NUFFT) is used to reconstruct images from k-space signals acquired along non-Cartesian trajectory and the reconstruction incorporates correction of multi-coil sensitivity. MCNUFFT is much faster than CS, e.g., seconds versus hours. For FIGS. 3A and 3B, the CS method was used to reconstruct images using 400, 800, 1200, 1600, and 2000 spokes.

Let $M^R(x, y, z, p)$ and $C^R(x, y, z, p)$ denote MR signals in the 4D MCNUFFT and compressed sensing reconstructions, respectively, using R spokes, where x, y and z represent the readout, phase encoding, slice directions in the spatial domain, and p represents the respiratory phase dimension. A 3D UNet structure was used to construct three deep learning networks, (1) UNet3DSlice, (2) UNet3DPhase, and (3) P2P. UNet is used herein as an example only. Other neural network may be used.

UNet3DSlice:

For the Unet3DSlice network (FIG. 3A), $M^R(x, y, z, p)$ was reformatted into 3D volumes $M_p^R(x, y, z)$ with 10 out of 96 slices included in the z dimension for a given phase p. The training inputs of the Unet3DSlice were $M_p^R(x, y, z)$, where R was 400, 800, 1200, 1600, or 2000. The training target was $C_p^{2000}(x, y, z)$. The training was performed by minimizing a loss function as follows:

$$\text{argmin}_\theta \Sigma_{R=400}^{2000} \Sigma_{p=1}^{N_p} \mathcal{L}(I_\theta(M_p^R(x,y,z)), C_p^{2000}(x,y,z)),$$

where $\mathcal{L}$ is the L1 norm, $I_\theta$ is the reconstruction model with trainable parameters $\theta$, and $N_p$ is the total number of respiratory phases.

UNet3DPhase:

For the Unet3DPhase network (FIG. 3B), $M^R(x, y, z, p)$ was reformatted into multiple 3D volumes $M_z^R(x, y, p)$ for a given slice z. The training inputs of the Unet3DPhase were $M_z^R(x, y, p)$, where R was 400, 800, 1200, 1600, or 2000. The training target was $C_z^{2000}(x, y, p)$. The loss function of UNet3DPhase is $$\text{argmin}_\theta \Sigma_{R=400}^{2000} \Sigma_{z=1}^{N_z} \mathcal{L}(I_\theta(M_z^R(x,y,z)), C_z^{2000}(x,y,z)),$$

where $\mathcal{L}$ is the L1 norm and $N_z$ is the total number of slices.

P2P:

In the P2P network (FIG. 3C), $M_z^R(x, y, p)$ are further separated into two sets with even ($M_z^R(x, y, p_{even})$) or odd ($M_z^R(x, y, p_{odd})$) respiratory phases for a given slice. $M_z^R(x, y, p_{even})$ and $M_z^R(x, y, p_{odd})$ were then used as training inputs and targets, and vice versa. The loss function of the P2P network is defined as follows $$\min_\theta \Sigma_{R=400}^{2000} \Sigma_{z=1}^{N_z} ( \mathcal{L}(I_\theta(M_z^R(x,y,p_{even})), M_z^{R+}(x,y,p_{odd})) + \mathcal{L}(I_\theta(M_z^R(x,y,p_{odd})), M_z^{R+}(x,y,p_{even})),$$

where $\mathcal{L}$ is the L1 norm, $R^+ \geq R$ denotes the number of radial spokes used in the target image to further increase the diversity of the artifact patterns in the training targets. For example, if $M_z^{400}(x, y, p_{odd})$ was used as the input, $M_z^{400}(x, y, p_{even})$, $M_z^{800}(x, y, p_{even})$, $M_z^{1200}(x, y, p_{even})$, $M_z^{1600}(x, y, p_{even})$, or $M_z^{2000}(x, y, p_{even})$, was used as the target.

The minimization problem is solved by using an optimization algorithm, e.g., stochastic gradient-based optimization algorithms such as Adam. The training of all networks was performed using sagittal images from 8 healthy participants. Images from another healthy participant were used for validation. Once the optimal set of parameters $\theta$ has been learned on the training data, the operator $I_\theta$ is applied to the independent testing data as demonstrated in FIG. 3D. MCNUFFT reconstructed images using 400, 800, 1200, 1600, or 2000 spokes were used as testing inputs. While the P2P network training used 5 respiratory phases during training, the trained network is applied to all 10 respiratory phases during testing. In other words, in testing, the inputs to the P2P network are crude images such as crude images reconstructed with MCNUFFT, without rearranging into even and odd phases, and clear images for all phases are output from the P2P network.

Figure 4A:
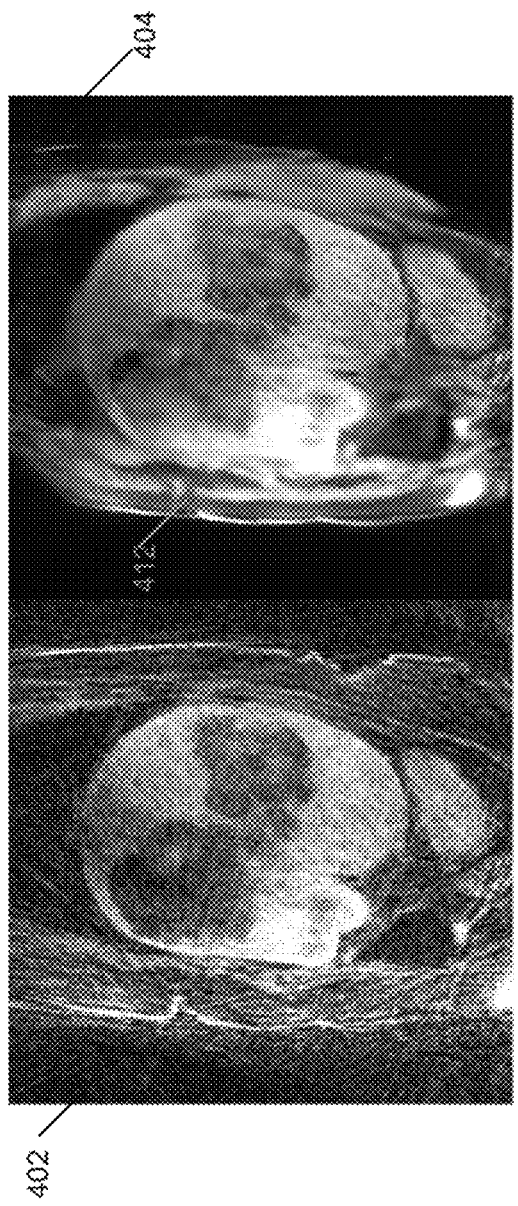
FIG. 4A shows images reconstructed using non-uniform fast Fourier transform (NUFFT) and the neural network models shown in FIGS. 3A-3C.
Figure 4A:
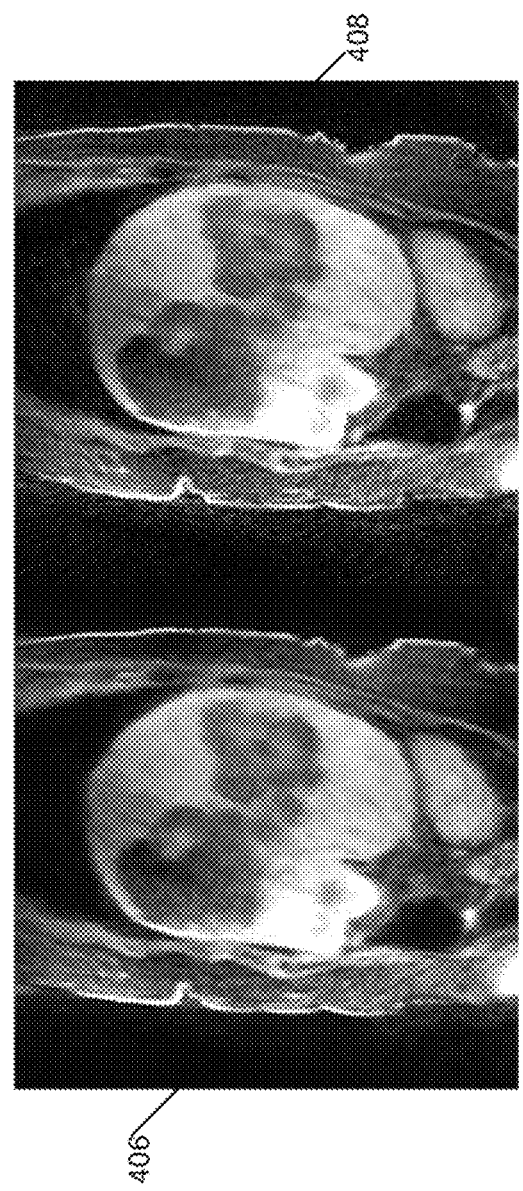
Figure 4B:
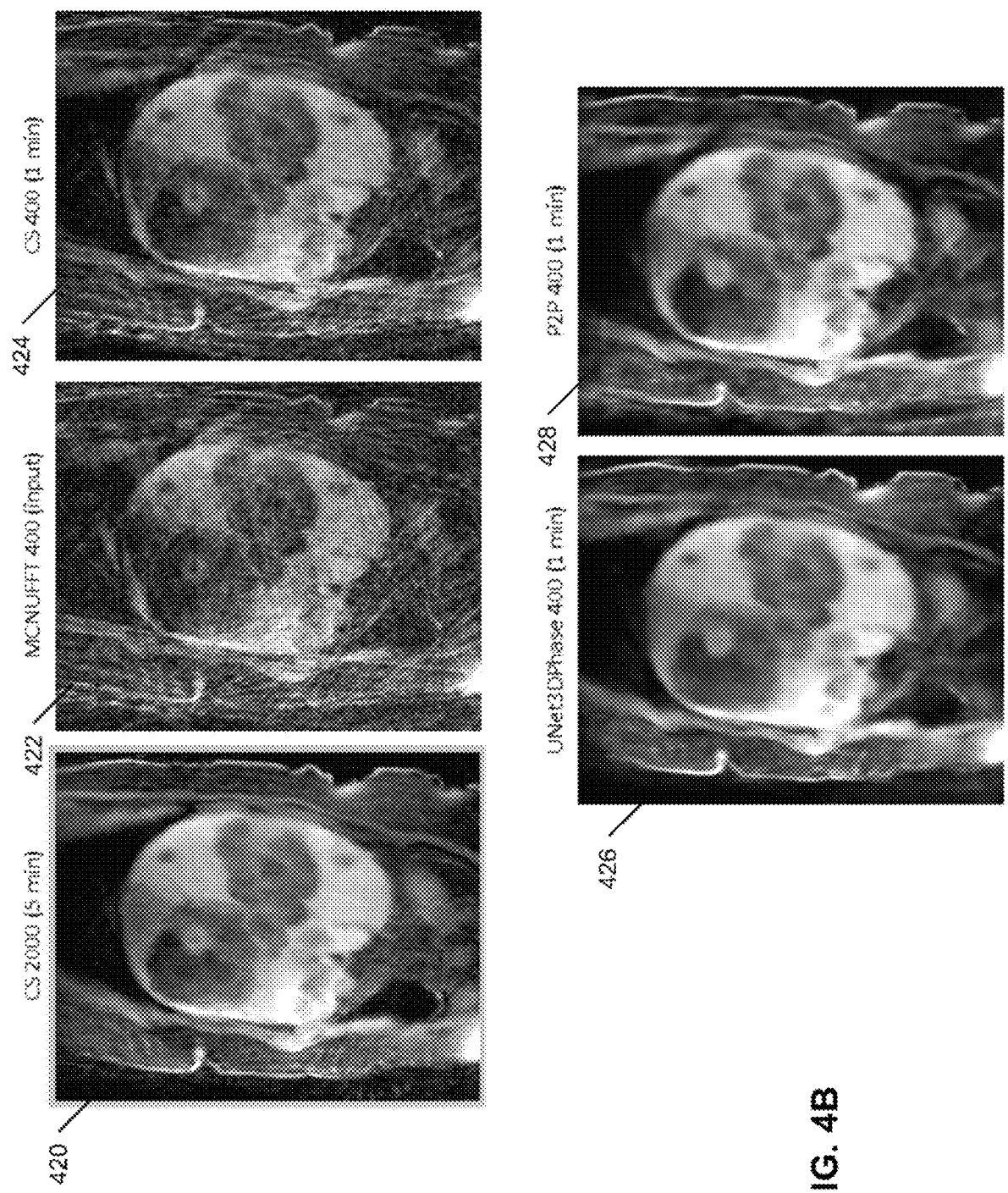
FIG. 4B shows images reconstructed using CS, NUFFT, and the neural network models shown in FIGS. 3B and 3C.
Figure 4C:
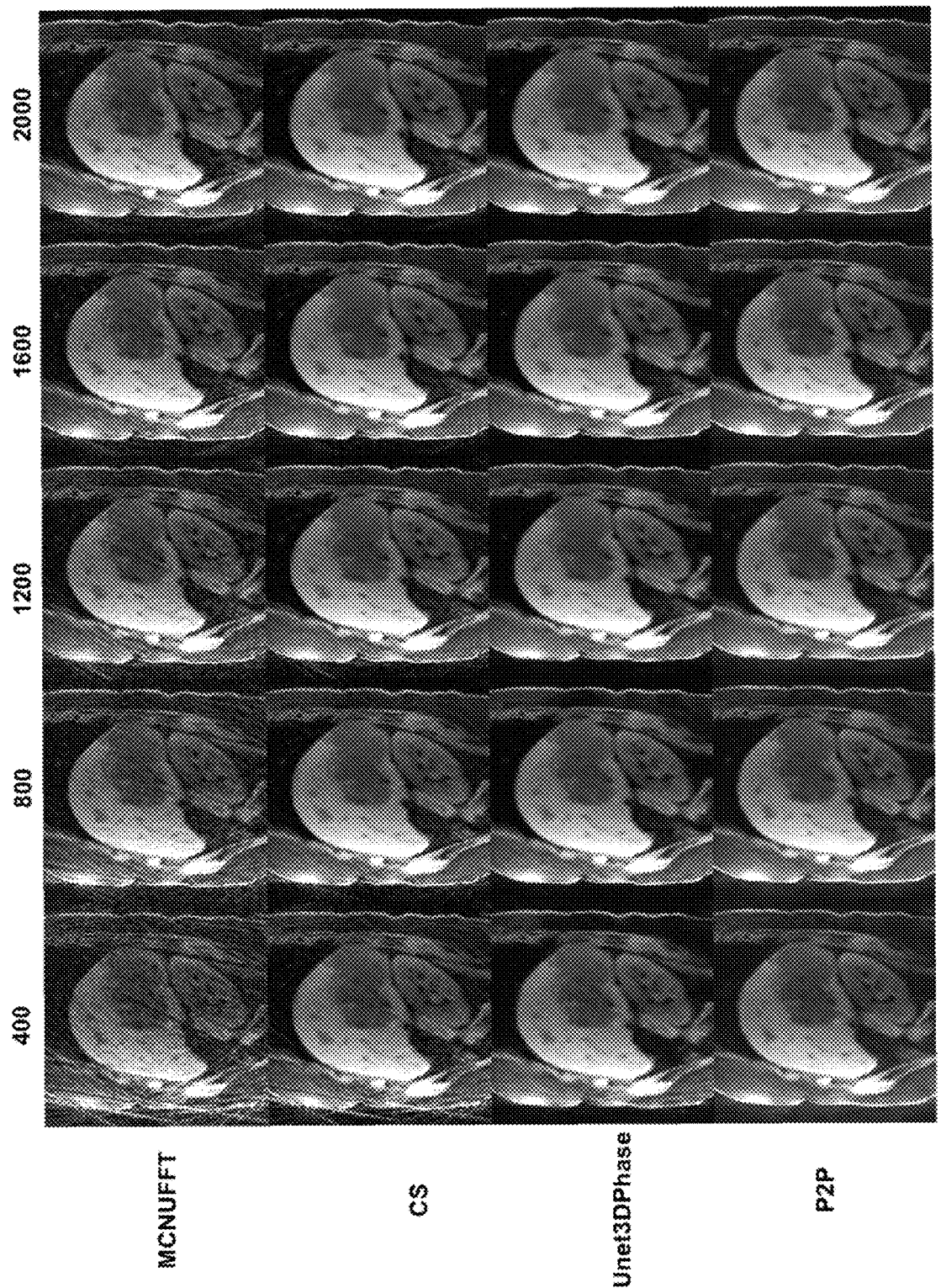
FIG. 4C shows images reconstructed using CS, NUFFT, and the neural network models shown in FIGS. 3B and 3C, with magnetic resonance (MR) signals acquired with different numbers of spokes in k-space.

FIGS. 4A-4C show images reconstructed with various methods, including with the systems and methods disclosed herein. FIG. 4A shows a comparison between UNet3DSlice (FIG. 3A) and UNet3DPhase (FIG. 3B). Image 402 is reconstructed by MCNUFFT with 800 spokes, image 404 is also reconstructed with 800 spokes but with UNet3DSlice800, and image 406 is reconstructed with 800 spokes with UNet3DPhase800. For comparison, image 408 is reconstructed with 2000 spokes using CS. The artifacts in images 404-408 are significantly reduced, compared to image 402. Comparing to images 406, 408, image 404 introduces new artifacts 412. Instead of removing or reducing the artifacts, the image 404 replaces the artifacts with low signals. In MR images acquired along respiratory phases, artifacts and noise across slices are coherent, because the slices are acquired the same time during the kz encoding. On the other hand, artifacts and noise across respiratory phases are relatively incoherent or randomized, because the images across respiratory phases are further apart. The neural network 303-a, 303-b is configured to remove incoherent features and keep coherent features. Because the artifacts are reduced in the surrogate ground truth 408, the neural network model 303-a reduces the signals at the voxels corresponding to the artifacts. In contrast, in neural network 303-*b*, the signals across respiratory phases are retained while artifacts and noise are reduced as being incoherent.

FIG. 4B shows an image 420 reconstructed with CS 2000 (5 minute data having 2000 spokes), an image 422 reconstructed with MCNUFFT400 (400 spokes), image 424 reconstructed with CS400 (1 minute data having 400 spokes), and outputs 426, 428 from UNet3DPhase400 and P2P400, respectively. Image 422 is the input for both UNet3Dphase 400 and P2P400. Although MR signals are acquired with only 400 spokes, the image quality of images 426, 428 are comparable to the image 402, which was reconstructed with MR signals acquired with 2000 spokes. FIG. 4C shows the effects of number of spokes on image quality of the reconstructed images. The image quality of images output from P2P improves visibly when number of spokes increase from 400 to 800, but the improvement plateaus as the number of spokes further increases to 2000. As a result, the number of spokes may not need to be as high as 2000 but the output image from the P2P still has comparable image quality as the images acquired with 2000 spokes. Therefore, using the systems and methods herein may be used to decrease the time in image acquisition by reducing the number of spokes for each kx-ky plane, which is advantageous in applications where image acquisition of an increased speed is desired, such as dynamic contrast enhancement imaging.

CS reconstructions are capable of reconstructing artifact-free 4D motion-resolved MR images with 10 respiratory phases using datasets that include 2000 radial spokes, corresponding to an MR data acquisition time of about 5 minutes. However, CS does not minimize all artifacts in reconstructing images based on a smaller MR dataset, for example, a dataset that includes only 400 radial spokes, corresponding to an MR data acquisition time of about 1 minute (see FIG. 4C). In contrast, the P2P image reconstruction method as disclosed herein reconstructs high-quality images free from artifacts using only a fraction of the MR data.

Blinded Radiological Evaluation

Figure 5A:
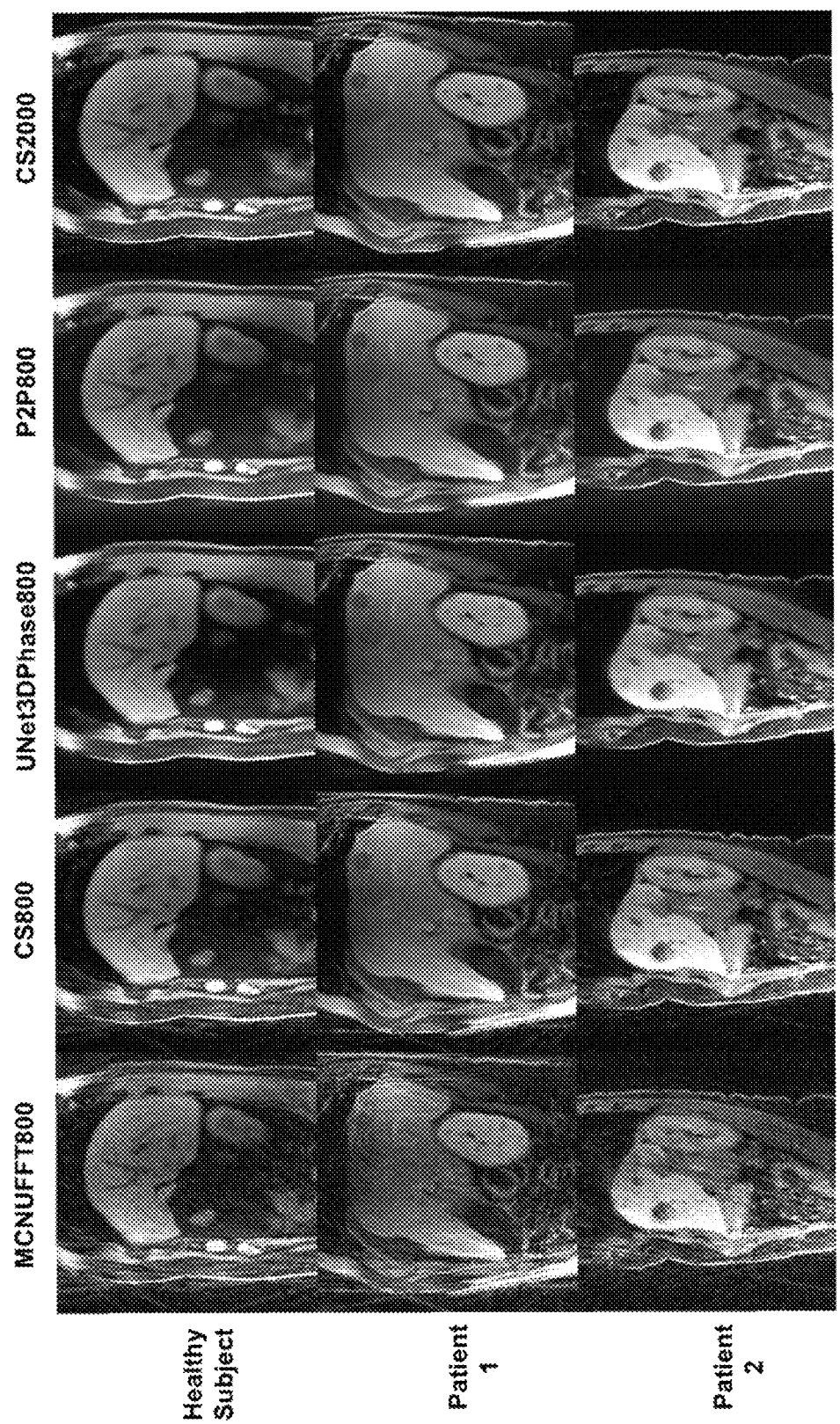
FIG. 5A is a schematic diagram of images presented to raters to rate image quality.
Figure 5B:
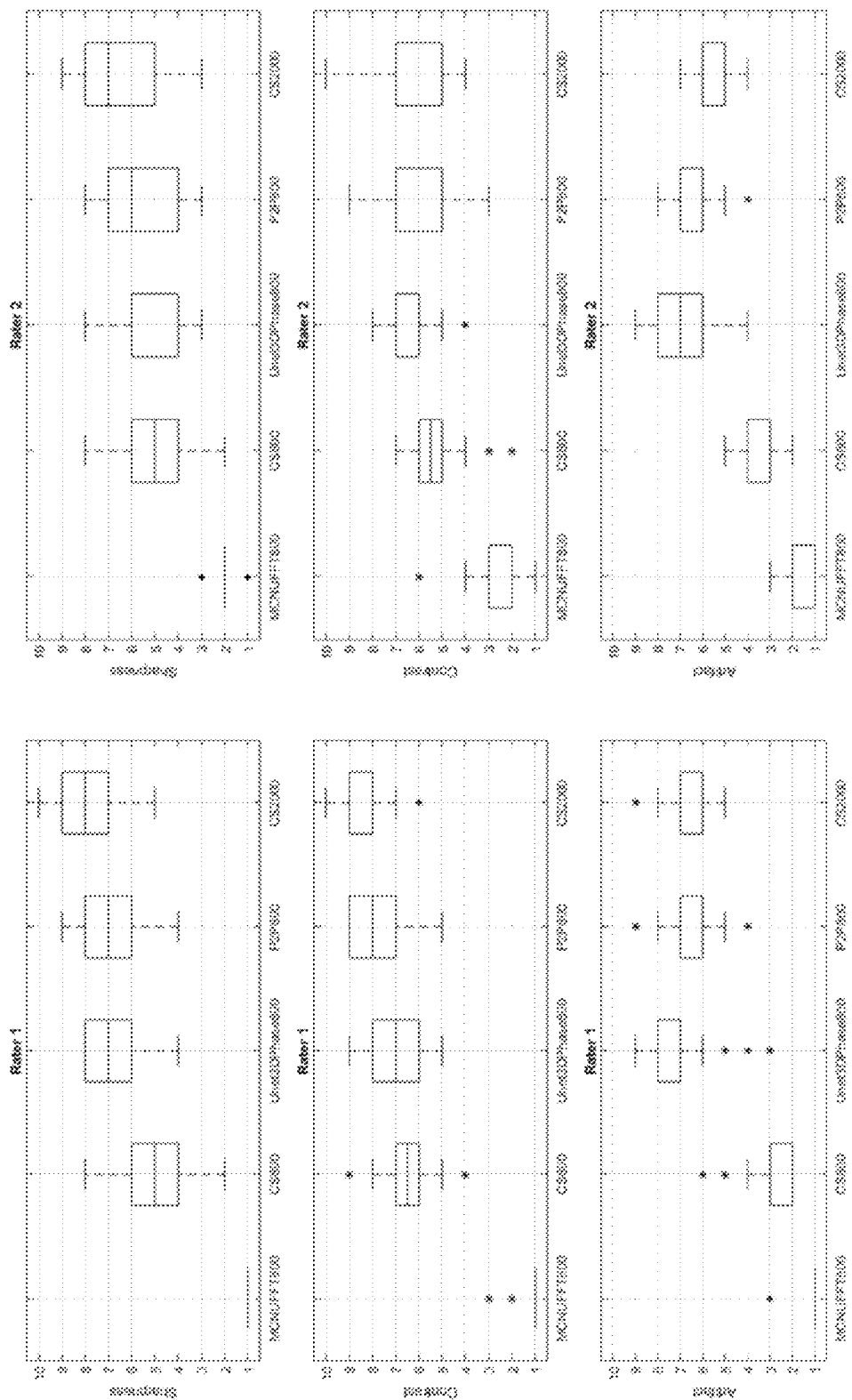
FIG. 5B shows results of the rating by the raters.

FIGS. 5A and 5B show blinded radiological evaluation conducted on images reconstructed with CS800, UNet3Dphase800, P2P800, where the MR signals were acquired with 800 spokes. In this study, a blinded radiological review was performed on reconstructed images acquired using 800 spokes. Two board certified radiologists independently assessed three image quality metrics of sharpness, contrast, and artifact freeness, based on predefined criteria. For each participant, a 2×3 montage of images was generated. MCNUFFT800 and CS2000 were placed in the first row as references. CS800, UNet3DPhase800, and P2P800 images were placed in the montage images' 2nd row with a randomized order on a per-participant basis. All image sets were viewed in a side-by-side fashion to facilitate direct comparisons among reconstruction methods. The reviewers were blinded to the reconstruction method used for each image set. Reviewers were able to scroll through the stack of images for each image set, as well as re-window according to personal viewing preferences. For each image set, metrics were scored using a 10-point Likert scale. For sharpness, the margins of hepatic lesions or (when no lesions were present) hepatic/portal vein branches were assessed [1=very indistinct; 10=very distinct]. For contrast, the prominence of hepatic lesions or (when no lesions were present) hepatic/portal vein branches was assessed, relative to the background liver parenchyma [1=very inconspicuous; 10=very conspicuous]. For artifact freeness, the presence of any artifacts adversely affecting the overall diagnostic quality of the images (most commonly, radial streaks) was assessed [1=severe degradation; 10=no appreciable degradation].

Statistical Analysis

A generalized estimating equations (GEEs) method was used to compare scores among different reconstruction types, considering correlation among scores measured from the same individual. The model was fit with scores as dependent variable and reconstruction-type, rater, and their interaction as explanatory variables. Wald Chi-square statistic for Type 3 analysis was used to test the significance of construction type-by-rater interaction. When the test was statistically significant, the comparisons for each rater were obtained from the fitted model with combined rater data. The independence working correlation structure was used. The pre-specified comparisons were made by using an appropriate linear combination of model parameter estimates. The statistical significance test of these comparisons and their 95% confidence intervals were based on empirical robust standard error. The model was fit for each of three aspects—sharpness, artifact, and contrast. SAS 9.4 was used for the analysis.

FIG. 5B shows the ratings by two raters. P2P and UNet3DPhase outperform CS as to sharpness, contrast, and artifact freeness. P2P and UNet3DPhase provide similar sharpness, P2P provides contrast better than or similar to UNet3DPhase, with images by P2P having more artifacts than images by UNet3DPhase.

In various other aspects, a self-navigated approach is disclosed that is robust to inter-subject variability and system imperfections, referred to herein as Consistently Acquired Projections for Tuned and Robust Estimation (CAPTURE). The acquisition in the CAPTURE approach is based on a $T_1$-weighted stack-of-stars spoiled 3D gradient-echo sequence with fat suppression with revisions to enable consistently acquired projections for a more robust detection of respiratory motion. For each azimuthal angle, CAPTURE acquires a navigator along the superior-inferior (SI) axis of the subject, and then a stack of identically oriented spokes with varying levels of partition encoding ($k_z$) are acquired, yielding a cylindrical k-space trajectory characterized as radial in-plane ($k_x$-$k_y$) and Cartesian along $k_z$.

Motion Detection Scheme

In various aspects, one detection scheme of CAPTURE uses the following temporospectral quality metric:

$$Q_{i,m} = \frac{\int_{0.1\,Hz}^{0.5\,Hz} |R_{i,m}(f)|df}{\int_{0.8\,Hz}^{\infty} |R_{i,m}(f)|df} \times \left(\frac{1}{\max_n r_{i,m}[n] - \min_n r_{i,m}[n]}\right) \quad [\text{Eq. 1}]$$

wherein $r_{i,m}[n]$ is an unfiltered respiratory curve and $R_{i,m}(f)$ is a discrete Fourier transform of $r_{i,m}[n]$.

In one aspect, $r_{i,m}[n]$ is obtained by peak detection along the columns of $A_{i,m}[x,n] \triangleq \text{Re}\{e^{-j\alpha_m} P_i[x,n]\}$, where i is the coil index, m is the phase rotation index that yields $\alpha_m = m \times 3.6°$, $P_i[x, n]$ is the complex projection matrix with x denoting the voxel index along the SI axis of the subject and n denoting the projection index or, equivalently, the stack-of-spokes index; and finally, Re(.) is the real part operator.

The best coil (i*) and the best phase rotation (m*) are then chosen according to:

$$(i^*, m^*) = \underset{(i,m)}{\operatorname{argmax}} Q_{i,m}. \qquad [\text{Eq. 2}]$$

For long acquisitions, the respiratory curves $r_{i,m}[n]$ include many samples. Consequently, the spectra $R_{i,m}(f)$ are not significantly contaminated by noise. However, when short scan durations are employed, $R_{i,m}(f)$ may become quite noisy. In another aspect, a revised quality metric may be used:

$$Q_{i,m} = \frac{\int_{f_p-\Delta}^{f_p+\Delta}|R_{i,m}(f)|df}{\int_{f_p+\Delta}^{\infty}|R_{i,m}(f)|df} \times \left(\frac{1}{\max_n r_{i,m}[n] - \min_n r_{i,m}[n]}\right) \times \frac{1}{\int_{0.8\,Hz}^{1.5\,Hz}|R_{i,m}(f)|df} \qquad [\text{Eq. 3}]$$

where $f_p$ is the location of the (respiratory) spectral peak within (0.1, 0.5) Hz and $\Delta=0.075$ Hz.

In various aspects, the revised quality metric of Eq. 3 incorporates several revisions relative to the quality metric of Eq. 2. The integration range in the numerator of the first ratio is significantly narrowed down (from 0.4 Hz to $2\Delta=0.15$ Hz). The mostly non-respiratory integration range in the denominator of the first ratio is made wider. The temporal range term associated with $r_{i,m}[n]$, i.e. the second term of Eq. 3, remains the same as the corresponding term in Eq. 2. A third term is incorporated within Eq. 3 that requires enhanced cleanliness of the spectral portions where no respiratory or acquisition-related peak exists. In typical CAPTURE acquisitions, the selected range (0.8, 1.5) Hz satisfies this "silent spectral range" condition.

Estimation of Deformable Motion Vector Field

In the exemplary embodiment, registration, such as a non-linear registration like a non-linear advanced normalization tools registration, was employed to register images across different respiratory phases using the expiration phase as the reference. 3D deformable motion vector field (MVF) was then estimated from the original images and the registered images. The images are reconstructed using the MCNUFFT, CS, UNet3DPhase, and P2P methods. A motion vector field is a vector field with each vector in the field indicating motion at that voxel, where the magnitude of the vector indicates the magnitude of the motion and the direction of the vector indicates the direction of the motion. The magnitudes and directions of the MVF between the inspiration and expiration phases were then displayed. In some embodiments, MVFs are used to correct motion in the images using the motion parameters in the MVFs (see later in FIGS. 10A-10D).

Figure 6E:
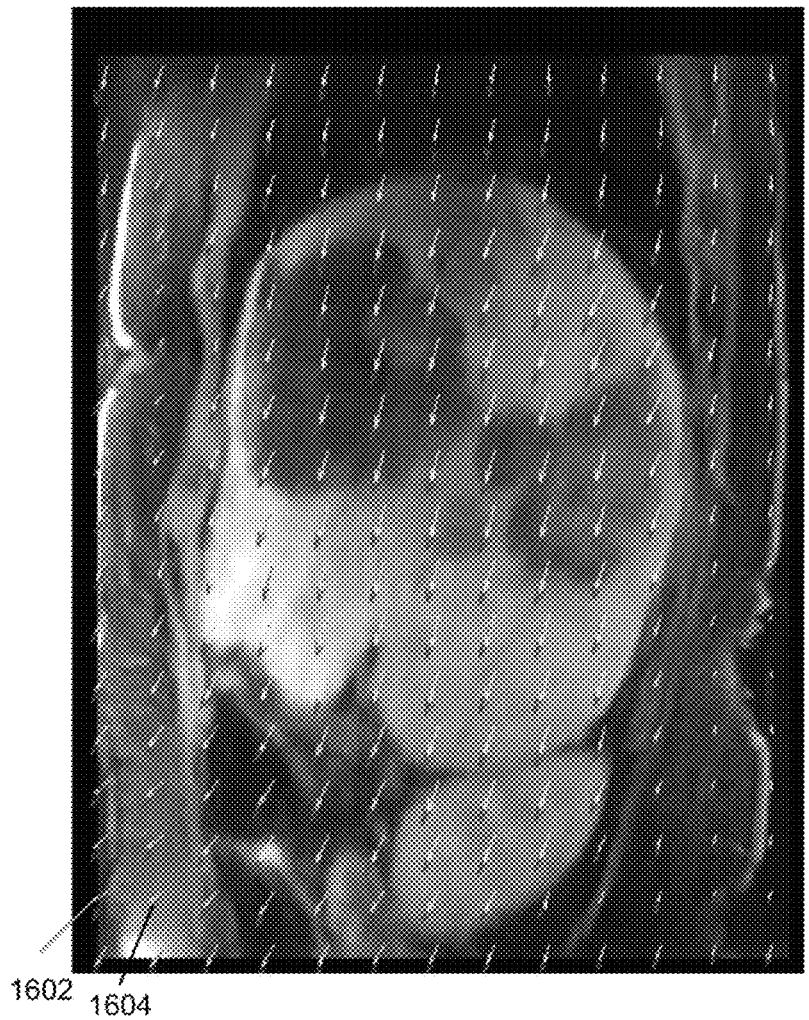
FIG. 6E shows the MVF in FIG. 6C overlaid over the MVF in FIG. 6D.

FIGS. 6A-6E shows motion vector fields with images reconstructed by MCNUFFT800 (FIG. 6A), CS2000 (FIG. 6B), UNet3DPhase800 (FIG. 6C), P2P800 (FIG. 6D). FIG. 6E shows the MVF derived with image reconstructed with UNet3D800 overlaid with MVFs derived with image reconstructed with P2P, where red arrows indicate MVFs for the image reconstructed with P2P and yellow arrows indicate MVFs for the image reconstructed with UNetPhase. The red and yellow arrows start from the pixel. The length of the arrow indicates the magnitude of the MVF at that pixel and the direction of the arrow indicates the direction of the MVF at that pixel. As shown in FIG. 6E, UNetPhase3D800 artificially reduces motion ranges. For example, the magnitude and range of angles of the MVF 1602 from UNetPhase3D800 are reduced, compared to the magnitude of the MVF 1604 from P2P.

The P2P image reconstruction method as disclosed herein overcomes at least several limitations of existing MR image reconstruction methods. In one aspect, the P2P image reconstruction method is fast compared to existing methods. Once the P2P neural network is trained, it only takes 27 seconds to reconstruct 4D MR images with a matrix size of 320×320×96×10 on a computer equipped with an Intel Xeon Gold 6130 Processor and an NVIDIA GeForce RTX 2080 Ti GPU. By contrast, existing image reconstruction methods, such as CS, are time consuming, which may take 7 to 8 hours on an Intel Xeon E5-2690v4 Broadwell-EP 2.60 GHz Fourteen Core 14 nm CPU. In another aspect, the deep learning network used in the P2P image reconstruction method as disclosed herein is trained without need for ground truth, which is typically difficult to procure. In an additional aspect, high quality MR images are obtainable using the P2P image reconstruction method independently of the orientation of the MR image. For example, if the neural network model 204 is trained with sagittal images, the neural network model 204 may be used to reconstruct images in other orientation such as axial, coronal, or oblique. In another additional aspect, the P2P image reconstruction method may be used to reconstruct MR datasets obtained for a wide variety of subject cohorts while maintaining a high quality of reconstructed MR images. The training of the deep learning network used to implement the P2P image reconstruction method as disclosed herein obviates the need for ground truth data, based on that MR data obtained during adjacent respiratory phases are similar with respect to objects within the images, but not with respect to image artifacts.

Figure 7A:
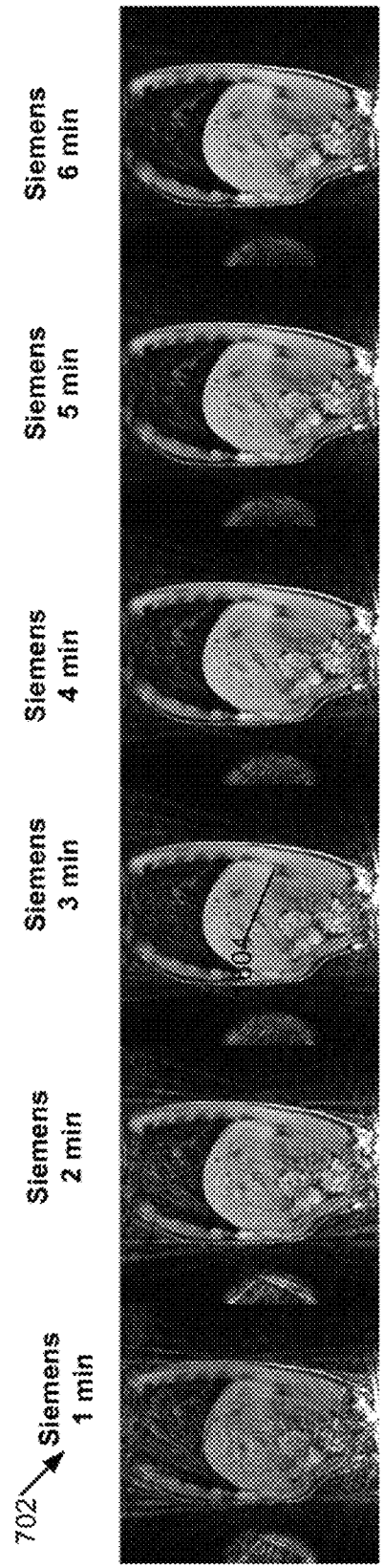
FIG. 7A shows images acquired with a first MRI system.
Figure 7B:
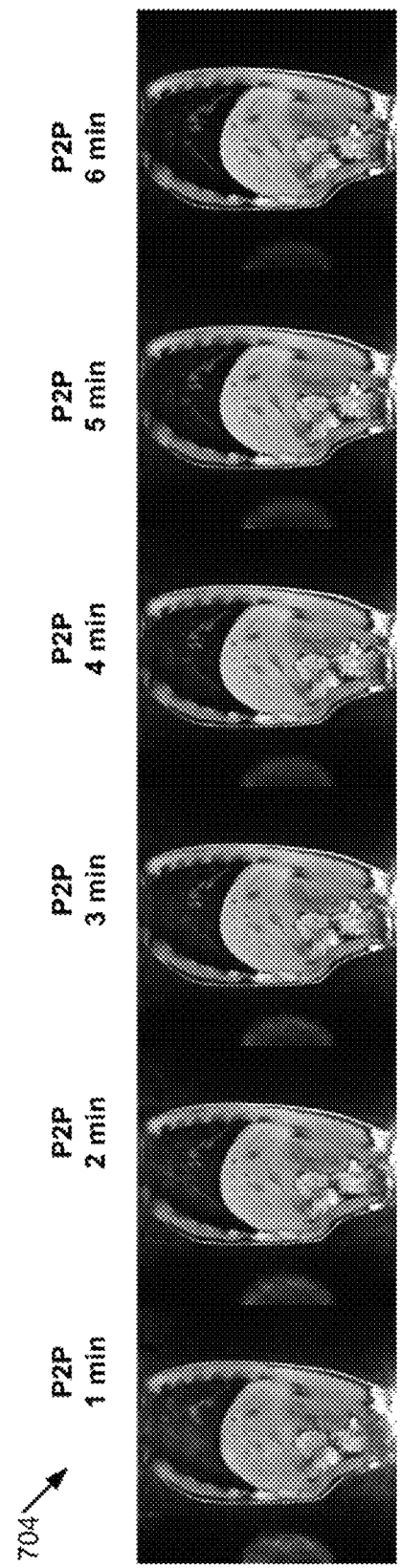
FIG. 7B shows images output from the neural network model shown in FIG. 3C and trained with images acquired with a second MRI system.

FIGS. 7A and 7B are images showing the systems and methods disclosed herein may be applied to images acquired with different MRI systems. FIG. 7A shows images 702 acquired with a first MRI system. The neural network model 204 is trained with images acquired with a second MRI system. The first and second MRI systems are both 3T systems. The training images and images 702 are acquired with the same type of pulse sequence, e.g., the stack-of-stars sequence, but with different system, acquisition, and sequence configurations. FIG. 7B shows the outputs 704 of the neural network model 204 with the images 702 as inputs, where the images 704 have reduced artifacts and noise than images 702.

Figure 8:
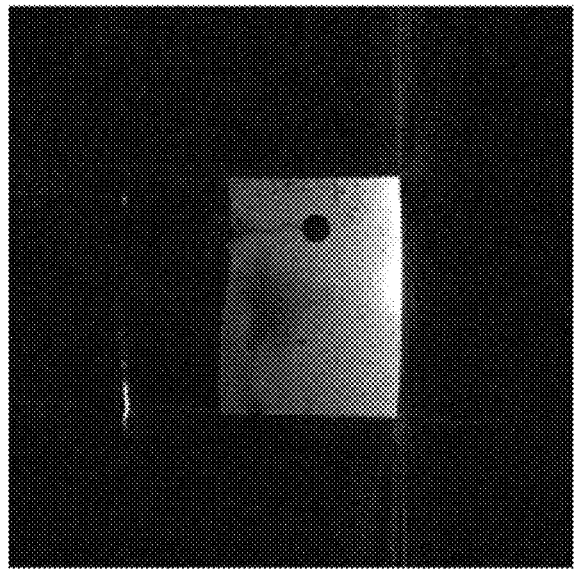
FIG. 8 shows phantom images based on MR signals acquired with a 0.35 T system and reconstructed with the neural network model shown in FIG. 3C and trained with images acquired with a 3T system.
Figure 8:
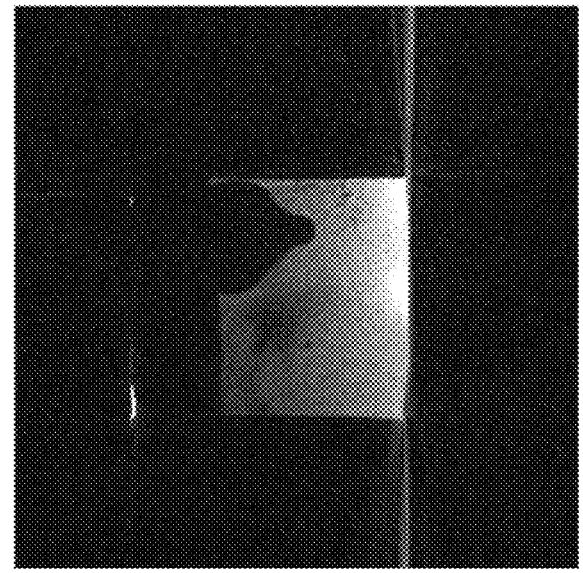
Figure 8:
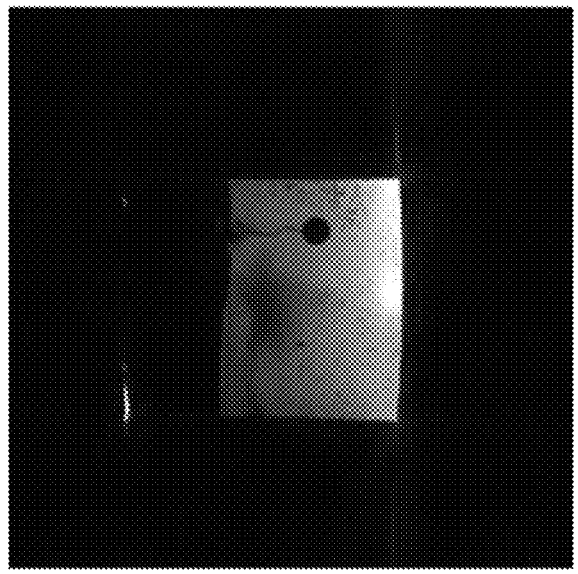
Figure 8:
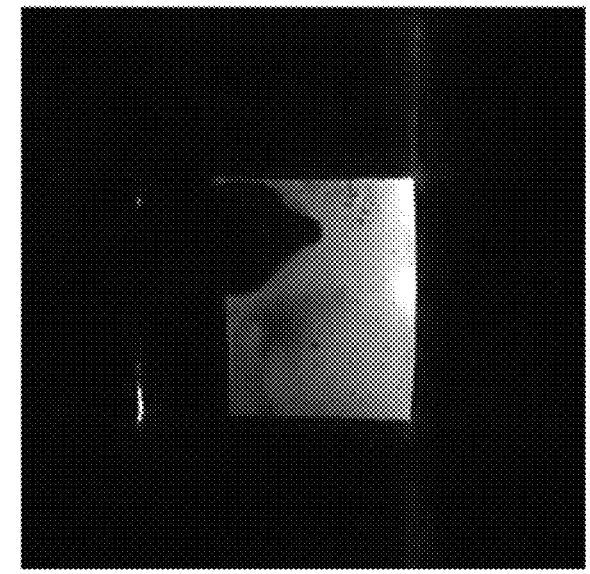
Figure 9A:
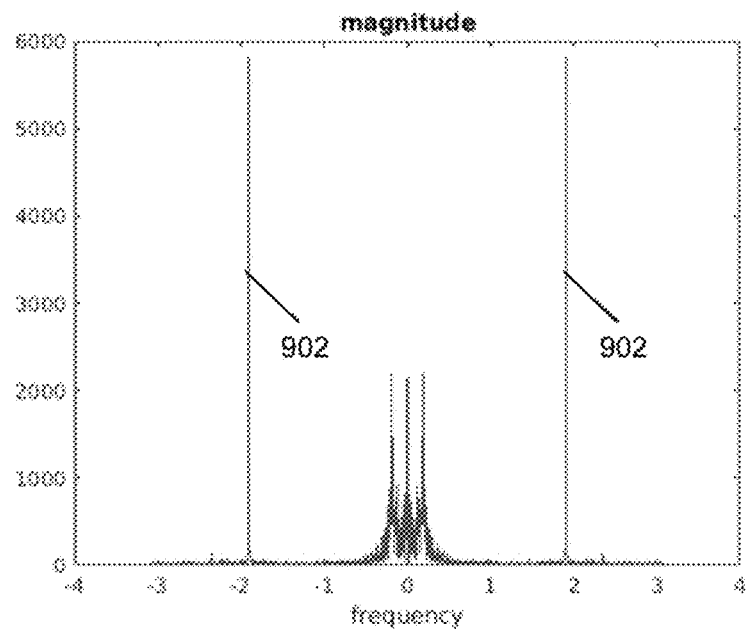
FIG. 9A shows a temporal spectrum of a respiratory curve derived based on images reconstructed with the neural network model shown in FIG. 3C and trained with images acquired with a 3T system.
Figure 9B:
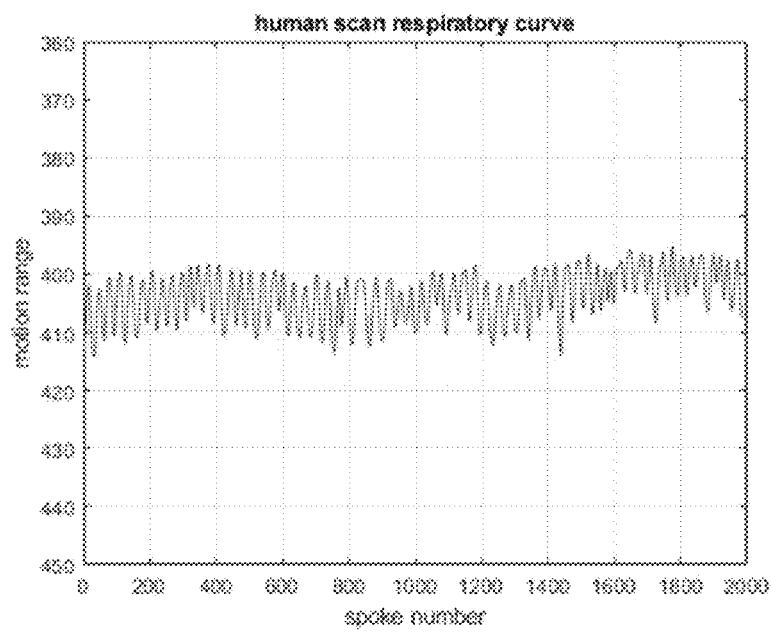
FIG. 9B shows a respiratory curve derived after filtering the respiratory curve corresponding to the spectrum shown in FIG. 9A.
Figure 9C:
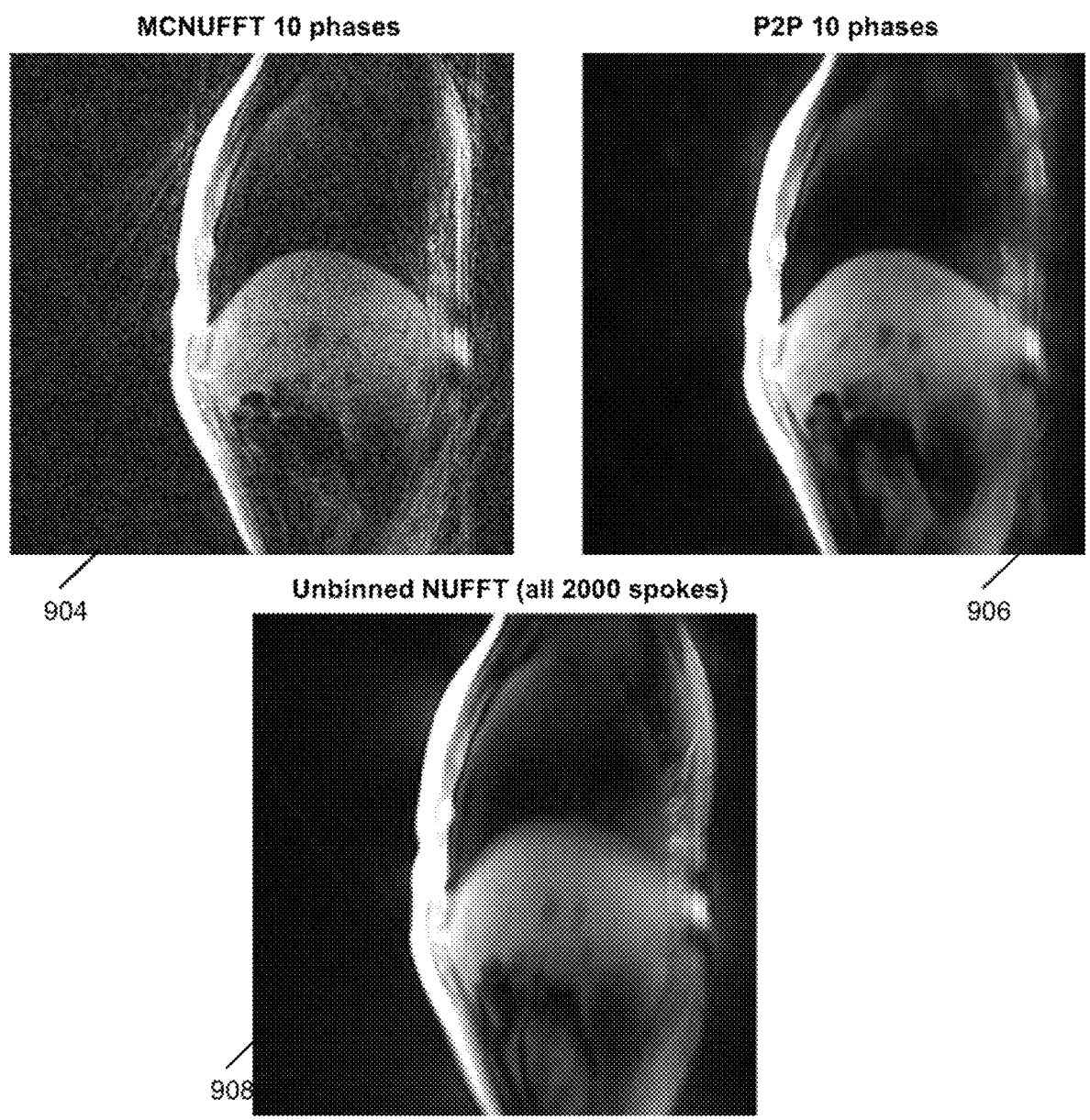
FIG. 9C shows images reconstructed by NUFFT and the neural network model shown in FIG. 3C and trained with images acquired with a 3T system.

FIGS. 8-9C include images showing the systems and methods disclosed herein may be applied to images acquired with MRI systems of different field strength. FIG. 8 shows phantom images. FIG. 9A shows a spectrum of a respiratory curve before filtering is applied, where the spectrum is derived based on the images reconstructed by the systems and methods disclosed herein. FIG. 9B shows a respiratory curve after filtering out signals at unwanted frequencies 902 in the respiratory curve. FIG. 9C shows MCNUFFT image 904, P2P image 906, and an unbinned NUFFT image 908 reconstructed from MR signals that are acquired with all 2000 spokes but not rebinned according to their respiratory phases. Image 906 has much reduced artifacts and noise than image 904, while the image 908 is blurred due to respiratory motion.

In the exemplary embodiment, the neural network model 204 is trained with images acquired with a 3T MRI system.

The inputs to the neural network model 204 are acquired with a 0.35 T MR system. Images acquired with a scanner of a lower field strength has a much lower signal to noise ratio than an image acquired with a scanner of a higher field strength. Scanner of a field strength are often open magnet and suitable for radiation therapy and imaging-guided surgery, and for a special group of subjects such as claustrophobic subjects. Accordingly, the systems and methods disclosed herein may be used to reconstruct high quality images for motion tracking and compensation in low field MR systems.

Figure 10A:
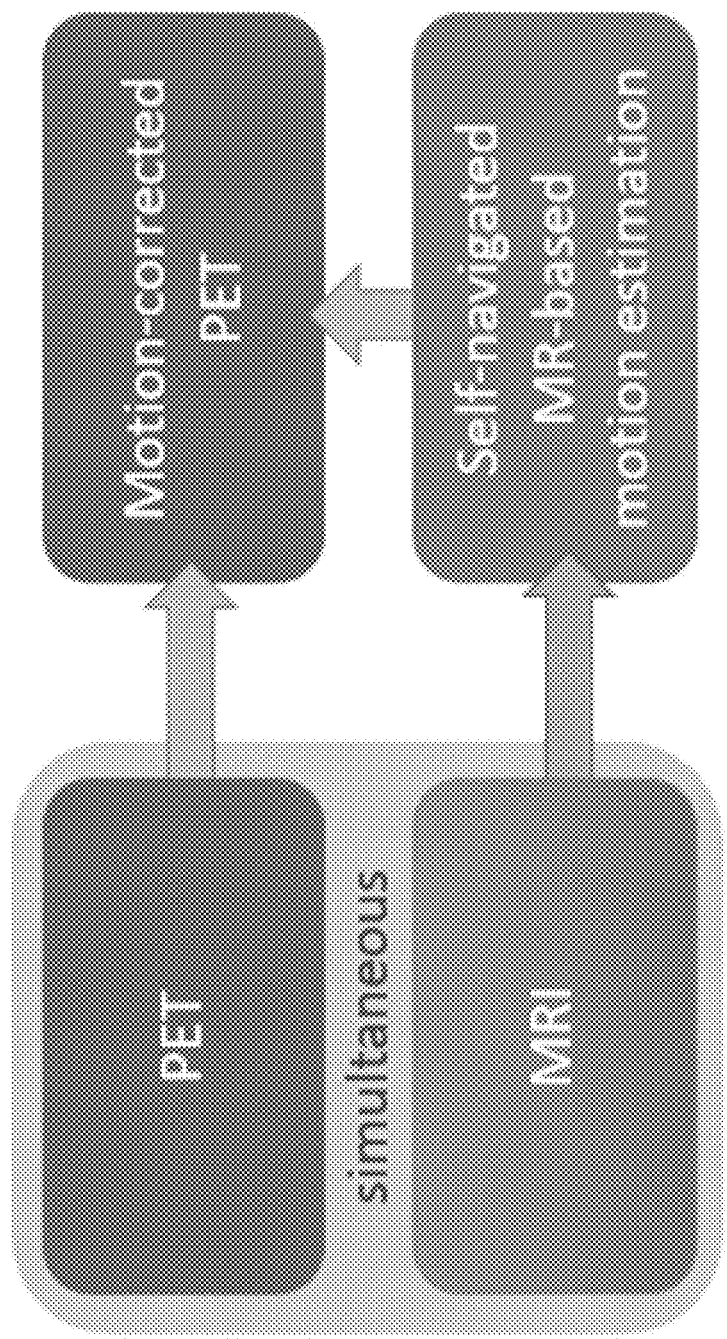
FIG. 10A is a schematic diagram of reconstructing positron emission tomography (PET) images in a PET/MR system.
Figure 10B:
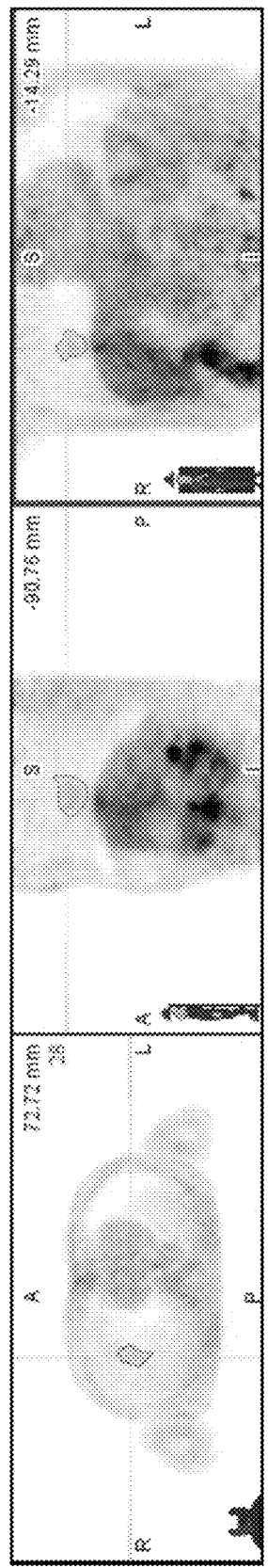
FIG. 10B shows PET images without motion correction.
Figure 10C:
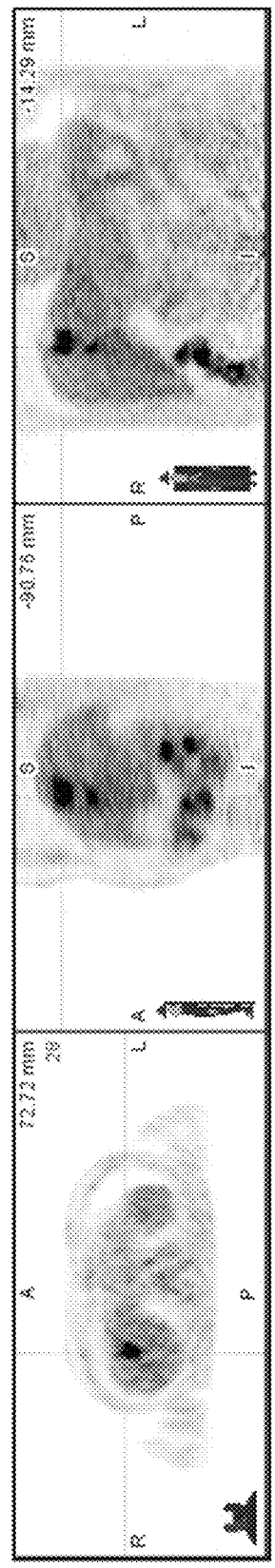
FIG. 10C shows PET images with motion correction based on MVF derived using NUFFT reconstructed MR images.
Figure 10D:
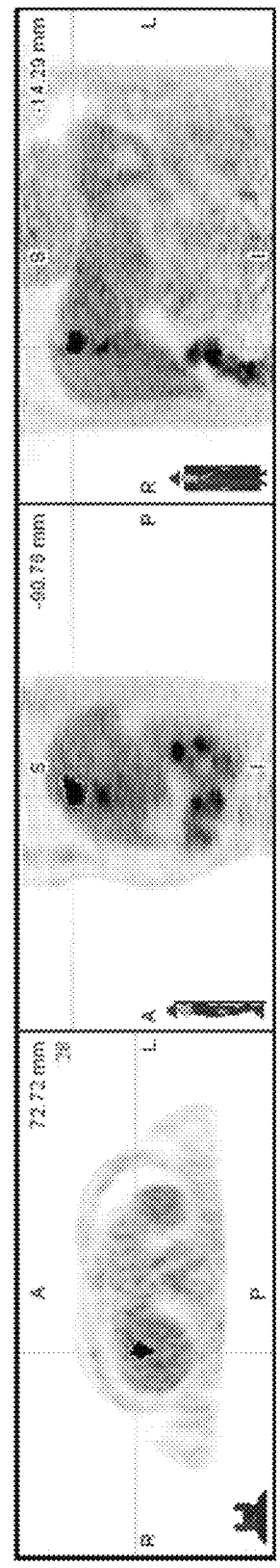
FIG. 10D shows images with motion correction based on MVF derived using MR images reconstructed with the neural network model shown in FIG. 3C.

FIGS. 10A-10D show how the systems and methods disclosed herein may be used to correct motion in images acquired with a different imaging modality, such as a positron emission tomography (PET). FIG. 10A is a schematic diagram of the systems and methods disclosed herein for motion correction of PET images acquired by a combined MRI/PET system. The MR and PET signals of a subject are acquired simultaneously. The MR images are acquired by the MRI part of the MRI/PET system, and the PET images are acquired by the PET part of the MRI/PET system. The MR images may be acquired with a CAPTURE sequence, which is self-navigated. Alternatively, the MR images may be acquired with a navigator sequence or other motion monitoring techniques. The systems 200 and methods 250 are used to reconstruct the MRI images and derive MVFs based on the reconstructed images. The derived MVFs are then used to correct the motion in the PET images.

FIGS. 10B-10E show PET images reconstructed without motion correction (FIG. 10B), PET images 1002 with motion correction based on MVFs derived from MR images reconstructed by MCNUFFT on data acquired with 2000 spokes and of a 5-minute duration, and PET images 1004 with motion correction based on MVFs derived from MR images reconstructed by P2P on data acquired with 400 spokes and of a 1-minute duration. With much shorter image acquisition time and smaller spatial resolution, the PET images 1002 have comparable image quality as the PET images 1004 using the systems and methods described herein.

Figure 11A:
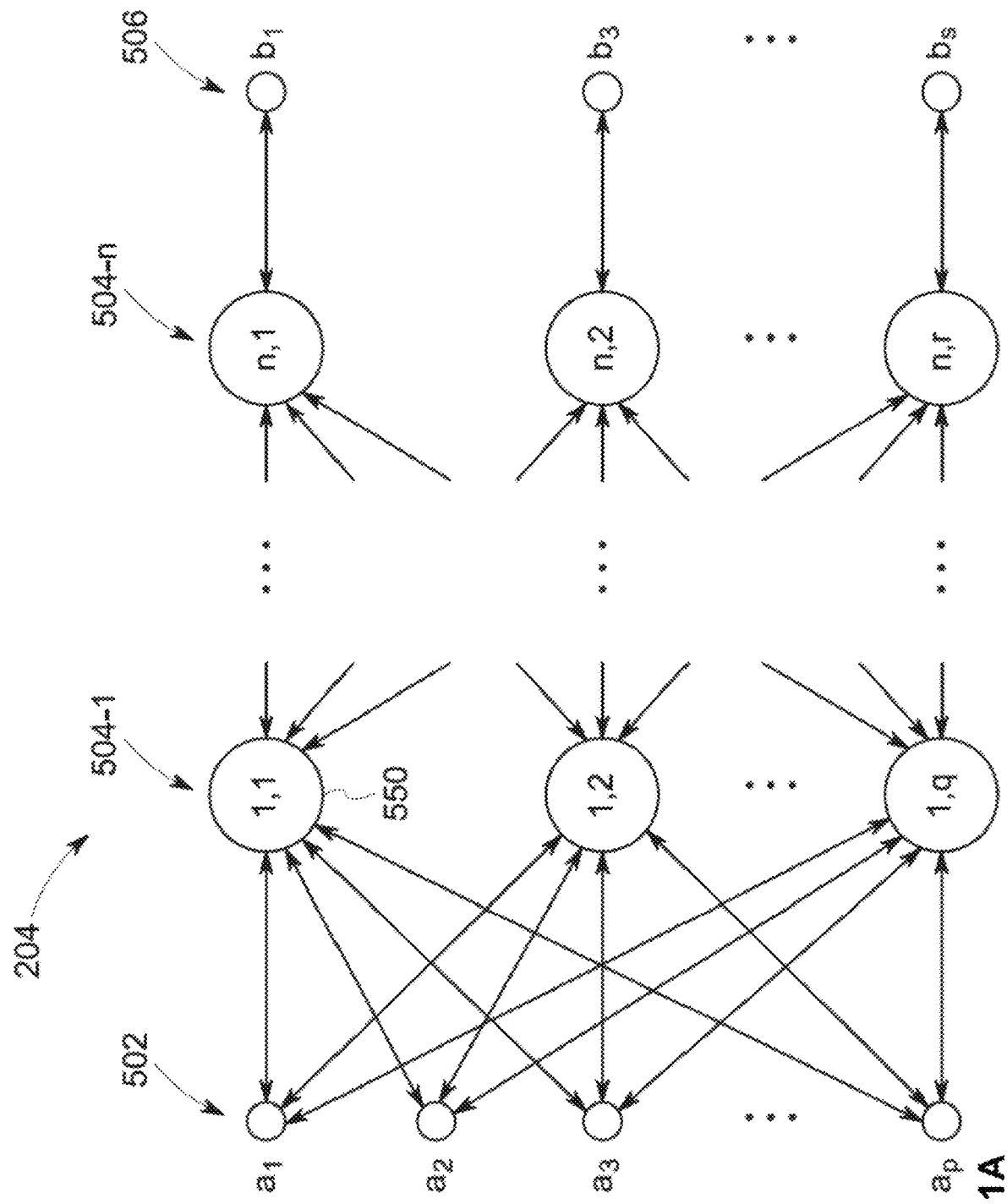
FIG. 11A is a schematic diagram of a neural network model.

FIG. 11A depicts an exemplary artificial neural network model 204. The exemplary neural network model 204 includes layers of neurons 502, 504-1 to 504-$n$, and 506, including an input layer 502, one or more hidden layers 504-1 through 504-$n$, and an output layer 506. Each layer may include any number of neurons, i.e., q, r, and n in FIG. 11A may be any positive integers. It should be understood that neural networks of a different structure and configuration from that depicted in FIG. 11A may be used to achieve the methods and systems described herein.

In the exemplary embodiment, the input layer 502 may receive different input data. For example, the input layer 502 includes a first input $a_1$ representing training images, a second input $a_2$ representing patterns identified in the training images, a third input $a_3$ representing edges of the training images, and so on. The input layer 502 may include thousands or more inputs. In some embodiments, the number of elements used by the neural network model 204 changes during the training process, and some neurons are bypassed or ignored if, for example, during execution of the neural network, they are determined to be of less relevance.

In the exemplary embodiment, each neuron in hidden layer(s) 504-1 through 504-$n$ processes one or more inputs from the input layer 502, and/or one or more outputs from neurons in one of the previous hidden layers, to generate a decision or output. The output layer 506 includes one or more outputs each indicating a label, confidence factor, weight describing the inputs, and/or an output image. In some embodiments, however, outputs of the neural network model 204 are obtained from a hidden layer 504-1 through 504-$n$ in addition to, or in place of, output(s) from the output layer(s) 506.

In some embodiments, each layer has a discrete, recognizable function with respect to input data. For example, if n is equal to 3, a first layer analyzes the first dimension of the inputs, a second layer the second dimension, and the final layer the third dimension of the inputs. Dimensions may correspond to aspects considered strongly determinative, then those considered of intermediate importance, and finally those of less relevance.

In other embodiments, the layers are not clearly delineated in terms of the functionality they perform. For example, two or more of hidden layers 504-1 through 504-$n$ may share decisions relating to labeling, with no single layer making an independent decision as to labeling.

Figure 11B:
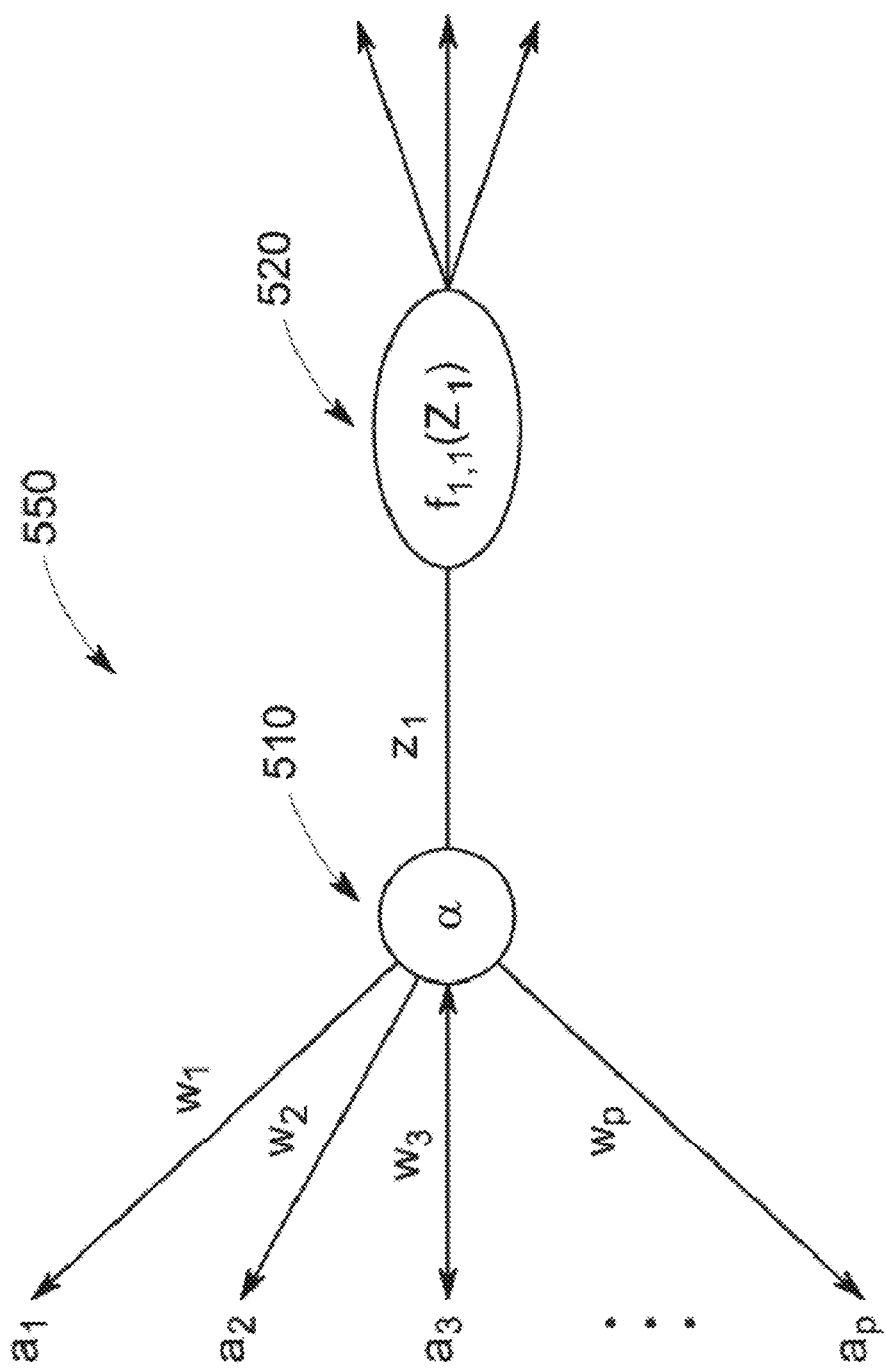
FIG. 11B is a schematic diagram of a neuron in the neural network model shown in FIG. 11A.

FIG. 11B depicts an example neuron 550 that corresponds to the neuron labeled as "1,1" in hidden layer 504-1 of FIG. 11A, according to one embodiment. Each of the inputs to the neuron 550 (e.g., the inputs in the input layer 502 in FIG. 11A) is weighted such that input $a_1$ through $a_p$ corresponds to weights $w_1$ through $w_p$ as determined during the training process of the neural network model 204.

In some embodiments, some inputs lack an explicit weight, or have a weight below a threshold. The weights are applied to a function a (labeled by a reference numeral 510), which may be a summation and may produce a value $z_1$ which is input to a function 520, labeled as $f_{1,1}(z_1)$. The function 520 is any suitable linear or non-linear function. As depicted in FIG. 5B, the function 520 produces multiple outputs, which may be provided to neuron(s) of a subsequent layer, or used as an output of the neural network model 204. For example, the outputs may correspond to index values of a list of labels, or may be calculated values used as inputs to subsequent functions.

It should be appreciated that the structure and function of the neural network model 204 and the neuron 550 depicted are for illustration purposes only, and that other suitable configurations exist. For example, the output of any given neuron may depend not only on values determined by past neurons, but also on future neurons.

The neural network model 204 may include a convolutional neural network (CNN), a deep learning neural network, a reinforced or reinforcement learning module or program, or a combined learning module or program that learns in two or more fields or areas of interest. Supervised and unsupervised machine learning techniques may be used. In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. The neural network model 204 may be trained using unsupervised machine learning programs. In unsupervised machine learning, the processing element may be required to find its own structure in unlabeled example inputs. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics, and information. The machine learning programs may use deep learning algorithms that may be primarily focused on pattern recognition, and may be trained after processing multiple examples. The machine learning programs may include Bayesian Program Learning (BPL), voice recognition and synthesis, image or object recognition, optical character recognition, and/or natural language processing—either individually or in combination. The machine learning programs may also include natural language processing, semantic analysis, automatic reasoning, and/or machine learning.

Based upon these analyses, the neural network model 204 may learn how to identify characteristics and patterns that may then be applied to analyzing image data, model data, and/or other data. For example, the model 204 may learn to identify features in a series of data points.

Figure 12:
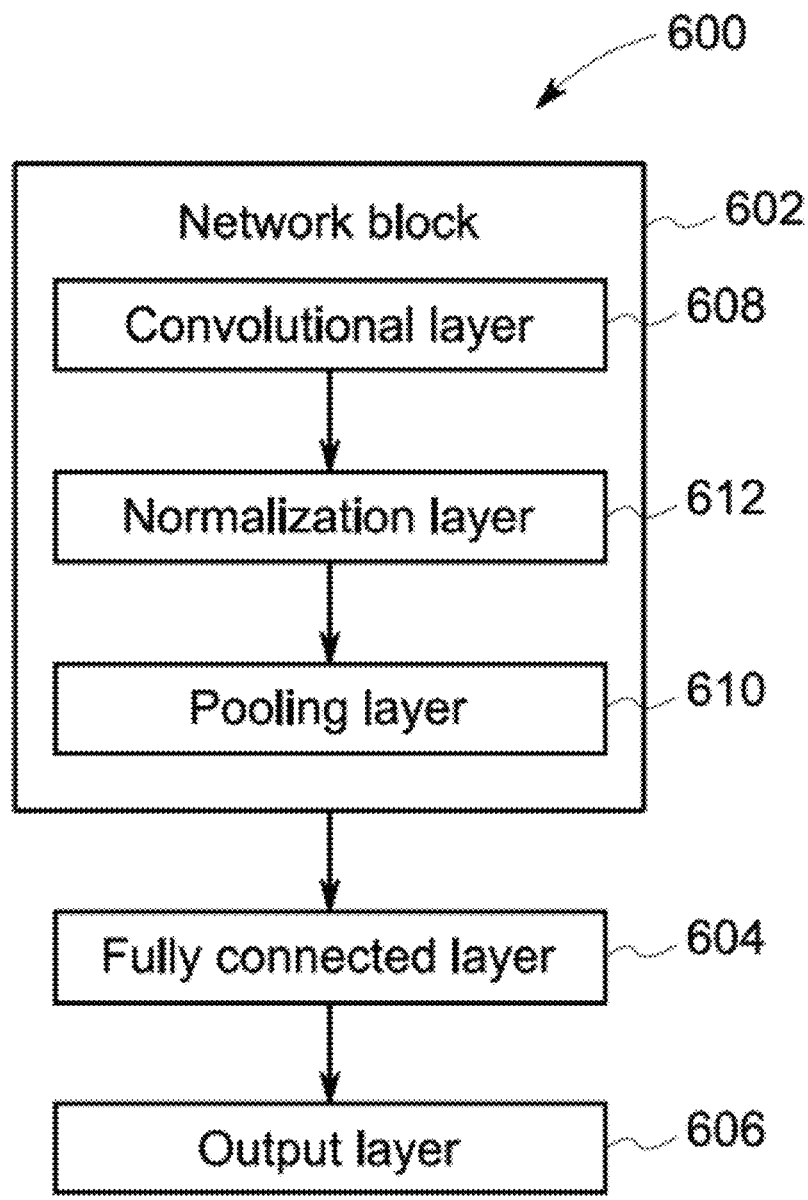
FIG. 12 is a schematic diagram of an exemplary convolutional neural network.

FIG. 12 is a block diagram of an exemplary CNN 600 that may be included in the neural network model 204. The CNN 600 includes a convolutional layer 608. In a convolutional layer, convolution is used in place of general matrix multiplication in a neural network model. In one example, a 1×1 convolution is used to reduce the number of channels in the neural network 600. The neural network 600 includes one or more convolutional layer blocks 602, a fully-connected layer 604 where the neurons in this layer is connected with every neuron in the prior layer, and an output layer 606 that provides outputs.

In the exemplary embodiment, the convolutional layer block 602 includes a convolutional layer 608 and a pooling layer 610. Each convolutional layer 608 is flexible in terms of its depth such as the number of convolutional filters and sizes of convolutional filters. The pooling layer 610 is used to streamline the underlying computation and reduce the dimensions of the data by combining outputs of neuron clusters at the prior layer into a single neuron in the pooling layer 610. The convolutional layer block 602 may further include a normalization layer 612 between the convolutional layer 608 and the pooling layer 610. The normalization layer 612 is used to normalize the distribution within a batch of training images and update the weights in the layer after the normalization. The number of convolutional layer blocks 602 in the neural network 600 may depend on the image quality of training images, and levels of details in extracted features.

In operation, in training, training images and other data such as extracted features of the training images are inputted into one or more convolutional layer blocks 602. Observed masks corresponding to the training images are provided as outputs of the output layer 606. Neural network 600 is adjusted during the training. Once the neural network 600 is trained, an input image is provided to the one or more convolutional layer blocks 602 and the output layer 606 provides outputs that include a mask associated with the input image.

Figure 13:
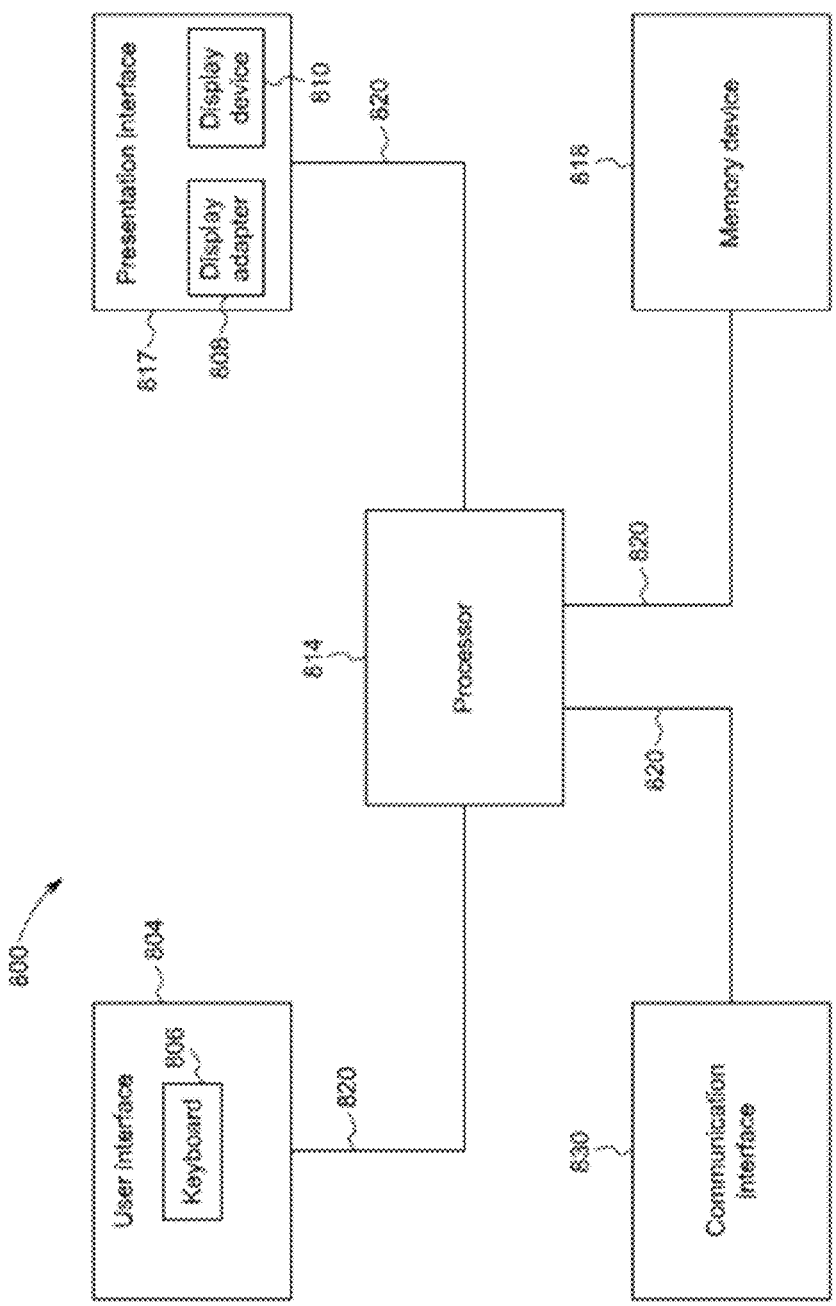
FIG. 13 is a block diagram of an exemplary computing device.

The workstation 12 and the MR image reconstruction computing device 202, 202-2 described herein may be any suitable computing device 800 and software implemented therein. FIG. 13 is a block diagram of an exemplary computing device 800. In the exemplary embodiment, the computing device 800 includes a user interface 804 that receives at least one input from a user. The user interface 804 may include a keyboard 806 that enables the user to input pertinent information. The user interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the exemplary embodiment, computing device 800 includes a display interface 817 that presents information, such as input events and/or validation results, to the user. The display interface 817 may also include a display adapter 808 that is coupled to at least one display device 810. More specifically, in the exemplary embodiment, the display device 810 may be a visual display device, such as a cathode ray tube (CRT), a liquid crystal display (LCD), a light-emitting diode (LED) display, and/or an "electronic ink" display. Alternatively, the display interface 817 may include an audio output device (e.g., an audio adapter and/or a speaker) and/or a printer.

The computing device 800 also includes a processor 814 and a memory device 818. The processor 814 is coupled to the user interface 804, the display interface 817, and the memory device 818 via a system bus 820. In the exemplary embodiment, the processor 814 communicates with the user, such as by prompting the user via the display interface 817 and/or by receiving user inputs via the user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are exemplary only, and thus are not intended to limit in any way the definition and/or meaning of the term "processor."

In the exemplary embodiment, the memory device 818 includes one or more devices that enable information, such as executable instructions and/or other data, to be stored and retrieved. Moreover, the memory device 818 includes one or more computer readable media, such as, without limitation, dynamic random access memory (DRAM), static random access memory (SRAM), a solid state disk, and/or a hard disk. In the exemplary embodiment, the memory device 818 stores, without limitation, application source code, application object code, configuration data, additional input events, application states, assertion statements, validation results, and/or any other type of data. The computing device 800, in the exemplary embodiment, may also include a communication interface 830 that is coupled to the processor 814 via the system bus 820. Moreover, the communication interface 830 is communicatively coupled to data acquisition devices.

In the exemplary embodiment, the processor 814 may be programmed by encoding an operation using one or more executable instructions and providing the executable instructions in the memory device 818. In the exemplary embodiment, the processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

At least one technical effect of the systems and methods described herein includes (a) reduction of artifacts in MR images based on sparsely-sampled MR signals; (b) training a neural network model without ground truth or surrogate truth; (c) fast reconstruction of MR images having reduced artifacts; (d) production of MR images of comparable image quality with reduced sampling; (e) reconstruction of images using neural network model trained with images acquired with a different system; and (f) motion correction using images with reduced sampling.

Exemplary embodiments of systems and methods of image reconstruction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method of reconstructing magnetic resonance (MR) images of a subject, comprising:
    receiving MR signals;
    reconstructing crude MR images based on the MR signals;
    analyzing the crude MR images using a neural network model, wherein the neural network model was trained by:
        inputting a first subset of training MR images to the neural network model; and
        setting a second subset of the training MR images as target outputs of the neural network model, wherein each image in the first subset is acquired during a neighboring respiratory phase of at least one of the images in the second subset, the first subset and the second subset acquired with the same imaging parameters,
        wherein the neural network model is trained to retain signals across respiratory phases and reduce artifacts in input images to the neural network model;
    deriving clear MR images based on the analysis, wherein the clear MR images include reduced artifacts, compared to the crude MR images; and
    outputting the clear MR images.

2. The method of claim 1, wherein the training MR images were acquired by a first MRI system, and the received MR signals are acquired with a second MRI system different from the first MRI system.

3. The method of claim 1, wherein the training MR images had a first orientation different from a second orientation of the received MR signals.

4. The method of claim 1, wherein the MR signals are acquired along a non-Cartesian k-space trajectory, and reconstructing crude MR images further comprises:
    reconstructing the crude MR images based on the MR signals using a non-uniform Fourier transform.

5. The method of claim 1, wherein receiving MR signals further comprises:
    receiving MR signals acquired while the subject is free-breathing.

6. The method of claim 1, further comprising:
    computing a motion vector field based on the derived clear MR images.

7. The method of claim 2, wherein the first MRI system has a field strength higher than the second MRI system.

8. The method of claim 4, wherein the non-Cartesian k-space trajectory includes a plurality of kx-ky segments along a kz direction, each of the plurality of kx-ky segments includes radial spokes.

9. The method of claim 5, wherein the MR signals are acquired along a non-Cartesian k-space trajectory that includes a plurality of kx-ky segments along a kz direction, each of the plurality of kx-ky segments includes radial spokes, reconstructing crude MR images further comprising:
    estimating a respiratory curve based on the MR signals; and
    rebinning the crude MR images reconstructed from the MR signals into a plurality of respiratory phases based on the respiratory curve; and
    analyzing the MR images further comprising analyzing the rebinned crude MR images using the neural network model to derive the clear MR images.

10. The method of claim 6, further comprising:
    adjusting the clear MR images to correct motion based on the computed motion vector field.

11. The method of claim 6, wherein the MR signals are acquired by a combined positron emission tomography (PET)/MR system simultaneously with acquisition of PET signals of the subject, the method further comprising:
    adjusting PET images reconstructed from the PET signals to correct motion based on the computed motion vector field.

12. A magnetic resonance (MR) image reconstruction system comprising an MR image reconstruction computing device, the MR image reconstruction computing device comprising at least one processor in communication with at least one memory device, and the at least one processor programmed to:
    receive MR signals of a subject;
    reconstruct crude MR images based on the MR signals;
    analyze the crude MR images using a neural network model, wherein the neural network model was trained by:
        inputting a first subset of training MR images to the neural network model; and
        setting a second subset of the training MR images as target outputs of the neural network model, wherein each image in the first subset is acquired during a neighboring respiratory phase of at least one of the images in the second subset, the first subset and the second subset acquired with the same imaging parameters
    wherein the neural network model is trained to retain signals across respiratory phases and reduce artifacts in input images to the neural network model;

derive clear MR images based on the analysis, wherein the clear MR images include reduced artifacts, compared to the crude MR images; and output the clear MR images.

13. The MR image reconstruction system of claim 12, wherein the training MR images were acquired by a first MRI system, and the received MR signals are acquired with a second MRI system different from the first MRI system.

14. The MR image reconstruction system of claim 12, wherein the training MR images had a first orientation different from a second orientation of the received MR signals.

15. The MR image reconstruction system of claim 12, wherein the MR signals are acquired along a non-Cartesian k-space trajectory that includes a plurality of kx-ky segments along kz, each of the plurality of kx-ky segments includes radial spokes, the at least one processor is further programmed to:

reconstruct the crude MR images based on the MR signals using a non-uniform Fourier transform.

16. The MR image reconstruction system of claim 12, wherein the at least one processor is further programmed to:

compute a motion vector field based on the clear MR images.

17. The MR image reconstruction system of claim 13, wherein the first MRI system has a field strength higher than the second MRI system.

18. The MR image reconstruction system of claim 16, wherein the at least one processor is further programmed to:

adjust the clear MR images to correct motion based on the motion vector field.

19. The MR image reconstruction system of claim 16, wherein the MR signals are acquired by a combined positron emission tomography (PET)/MR system simultaneously with PET signals of the subject, the at least one processor is further programmed to:

adjust PET images reconstructed from the PET signals to correct motion based on the motion vector field.

20. A computer-implemented method of reducing artifacts in magnetic resonance (MR) images of a subject, comprising:

receiving crude MR images reconstructed based on MR signals; and training a neural network model using the crude MR images as training MR images by:

inputting a first subset of the crude MR images to the neural network model;

setting a second subset of the crude images as target outputs of the neural network model, wherein each image in the first subset was acquired during a neighboring respiratory phase of at least one of the images in the second subset, the first subset and the second subset acquired with the same imaging parameters;

analyzing the first subset of the crude MR images using the neural network model;

comparing outputs of the neural network model with the target outputs; and adjusting the neural network model based on the comparison, wherein the trained neural network model is configured to retain signals across respiratory phases and reduce artifacts in the crude MR images.

* * * * *